United States Patent
Tambat et al.

(10) Patent No.: US 10,028,380 B2
(45) Date of Patent: Jul. 17, 2018

(54) SEMICONDUCTOR PACKAGE WITH DUAL SECOND LEVEL ELECTRICAL INTERCONNECTIONS

(71) Applicant: SanDisk Technologies Inc., Plano, TX (US)

(72) Inventors: Abhishek Ramesh Tambat, Santa Clara, CA (US); Naveen Kini, San Jose, CA (US); Elad Baram, Sunnyvale, CA (US); Pradip Ghimire, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 14/521,303

(22) Filed: Oct. 22, 2014

(65) Prior Publication Data

US 2016/0120031 A1    Apr. 28, 2016

(51) Int. Cl.
  *H01L 23/02*    (2006.01)
  *H05K 1/11*    (2006.01)
  (Continued)

(52) U.S. Cl.
  CPC ........ *H05K 1/111* (2013.01); *H01L 23/49811* (2013.01); *H01L 23/49816* (2013.01); *H01L 23/49838* (2013.01); *H01L 24/97* (2013.01); *H05K 1/181* (2013.01); *H01L 23/3128* (2013.01); *H01L 24/13* (2013.01); *H01L 24/16* (2013.01); *H01L 24/32* (2013.01); *H01L 24/48* (2013.01); *H01L 24/73* (2013.01); *H01L 25/0652* (2013.01); *H01L 25/105* (2013.01); *H01L 25/18* (2013.01); *H01L 2224/05554* (2013.01); *H01L 2224/131* (2013.01); *H01L 2224/16227* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73253* (2013.01);
  (Continued)

(58) Field of Classification Search
  None
  See application file for complete search history.

(56) References Cited

U.S. PATENT DOCUMENTS 7,282,390 B2 * 10/2007 Tan ..................... H01L 23/3128
                                                        257/724
2002/0025585 A1 * 2/2002 Lam ..................... H01L 23/525
                                                        438/1

(Continued)

FOREIGN PATENT DOCUMENTS

GB     2317269 A     3/1998

OTHER PUBLICATIONS

International Search Report and Written Opinion dated Dec. 11, 2015 in International Patent Application No. PCT/US2015/051273, 9 pages.

*Primary Examiner* — Cory Eskridge
(74) *Attorney, Agent, or Firm* — Vierra Magen Marcus LLP

(57) ABSTRACT

A semiconductor package such as a multi-chip package is disclosed. The semiconductor package may be configured for dual second level interconnection onto a printed circuit board of a host device. Thus, a single semiconductor package may be used on host printed circuit boards having different configurations.

11 Claims, 19 Drawing Sheets

(51) Int. Cl.
- H01L 23/498 (2006.01)
- H05K 1/18 (2006.01)
- H01L 23/31 (2006.01)
- H01L 23/00 (2006.01)
- H01L 25/065 (2006.01)
- H01L 25/10 (2006.01)
- H01L 25/18 (2006.01)

(52) U.S. Cl.
CPC ...... *H01L 2224/73265* (2013.01); *H01L 2224/97* (2013.01); *H01L 2225/0651* (2013.01); *H01L 2225/06506* (2013.01); *H01L 2225/06568* (2013.01); *H01L 2225/1023* (2013.01); *H01L 2225/1094* (2013.01); *H01L 2924/00014* (2013.01); *H01L 2924/1433* (2013.01); *H01L 2924/1435* (2013.01); *H01L 2924/1436* (2013.01); *H01L 2924/15192* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01); *H05K 2201/10166* (2013.01)

(56) References Cited

U.S. PATENT DOCUMENTS

| | | | |
|---|---|---|---|
| 2009/0166825 A1* | 7/2009 | Camacho | H01L 23/3128 257/676 |
| 2010/0274965 A1* | 10/2010 | Cleveland | G06F 11/2089 711/114 |
| 2013/0159587 A1* | 6/2013 | Nygren | G11C 29/702 710/306 |
| 2014/0089609 A1* | 3/2014 | Kegel | H01L 23/49827 711/154 |

* cited by examiner

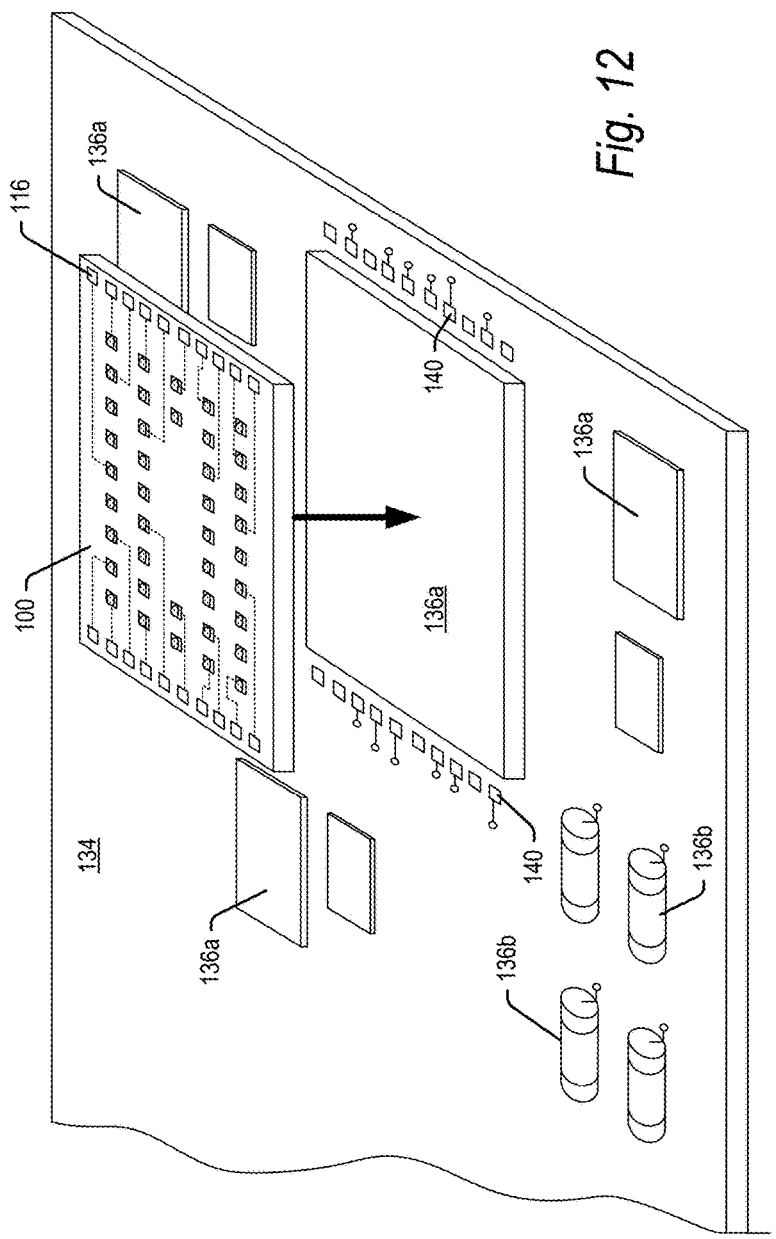
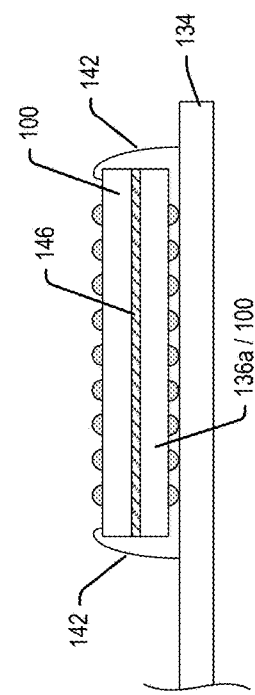

SEMICONDUCTOR PACKAGE WITH DUAL SECOND LEVEL ELECTRICAL INTERCONNECTIONS

BACKGROUND

The strong growth in demand for portable consumer electronics and solid state drives is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example computers, digital cameras, digital music players, video game consoles, PDAs and cellular telephones.

While many varied packaging configurations are known, flash memory storage cards may in general be fabricated as multi chip packages (MCPs), where a plurality of semiconductor chips are mounted and interconnected on a small footprint substrate. The substrate may in general include a rigid, dielectric base having a conductive layer etched on one or both sides. First level electrical interconnections are formed between the chips and the conductive layer(s) to route the chip signals to/from pads or solder bumps on a surface of the substrate. So called second level electrical interconnections are made between the pads or solder bumps on the substrate and a host device to transfer signals between the MCP and the host device.

MCPs may be land grid array (LGA) removable flash memory cards designed to be inserted and removed from a host device. Such MCPs may include contact fingers which may removably engage with contact pins within a host device to then allow the transfer of data to/from the MCP. Alternatively, MCPs may be ball grid array (BGA) packages which are permanently embedded (eMCPs) on a printed circuit board within a host device. Such eMCPs may include solder bumps for mounting onto the host printed circuit board. At present a single eMCP is not usable in multiple host device configurations.

DESCRIPTION OF THE DRAWINGS

FIG. 12 is a perspective view of a semiconductor package including dual second level electrical interconnections positioned for mounting on a printed circuit board according to embodiments of the present technology.

FIG. 13 is a side view of a semiconductor package including dual second level electrical interconnections mounted on a printed circuit board according to embodiments of the present technology.

DETAILED DESCRIPTION

Figure 1:
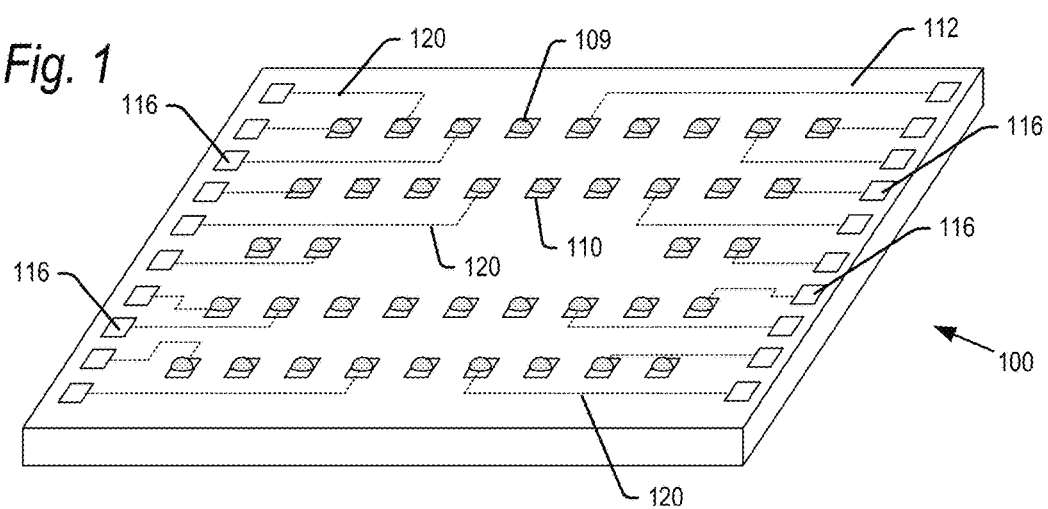
FIG. 1 is a bottom perspective view of a semiconductor package including dual second level electrical interconnections according to embodiments of the present technology.

The present technology will now be described with reference to FIGS. 1 through 29, which in embodiments relate to a semiconductor package configured for dual second level interconnection onto a printed circuit board (PCB) of a host device. Thus, a single semiconductor package may be used on host PCBs having different configurations. The host device may be a wide variety of electronic devices including but not limited to memory modules such as USB drives and SD memory cards, computers, digital cameras, digital music players, printers and copiers, video game consoles, cellular and other telephones, PDAs, kitchen and household appliances and automobiles.

In one embodiment, the semiconductor package of the present technology may include solder bumps on a first surface of the package, which solder bumps may be soldered to a corresponding pattern of contact pads on the host PCB for conventional second level interconnection with the PCB. The first surface of the semiconductor package may further include a plurality of second level interconnection (SLI) contact pads, for example at a periphery of one or more edges of the semiconductor package. In examples, the plurality of SLI contact pads may be electrically connected to the solder bump pads on the semiconductor package via electrical traces formed within the semiconductor package. The electrical traces carry signals on the solder bumps out to respective SLI contact pads.

The SLI contact pads provide a second method of electrically interconnecting the semiconductor package to the host PCB. Specifically, the semiconductor package may be mounted on a surface of the host PCB with the SLI contact pads facing upward. Thereafter, wire bonds may be formed between the SLI contact pads on the package and contact pads on the host PCB to electrically interconnect the package to the host PCB. In addition to providing dual second level interconnection options, the semiconductor package of the present technology provides increased flexibility as to its mounting location in the wire bonded example, possibly on top of other components on the host PCB.

In further embodiments, the present technology relates to reclaiming of a semiconductor package where one or more of the semiconductor die within package are found to be faulty, or for flexibility to manage inventory where die within the package are not faulty. The semiconductor package in the reclaim embodiment may for example be an eMCP with solder bumps and reclaim contact pads around a periphery of the semiconductor package. At least a subgroup of the plurality of reclaim contact pads may be directly connected to memory die within the semiconductor package. Thus, for example where a controller within the semiconductor package is faulty, the package may be mounted on a host PCB with the subgroup of SLI contact pads facing upwards. The subgroup of contact pads may thereafter be wire bonded to contact pads on the host PCB. Thereafter, a controller on the host PCB may access the wire bonded memory.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 2:
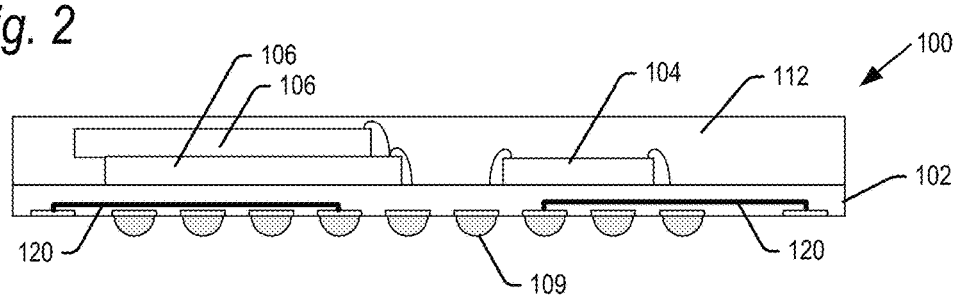
FIGS. 2 and 3 are side views of alternative embodiments of the semiconductor package shown in FIG. 1.
Figure 3:
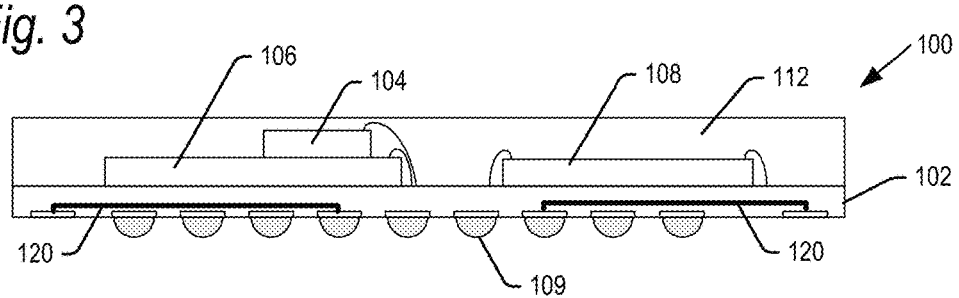

FIGS. 1-3 are bottom perspective and side views of a semiconductor package 100 according to embodiments of the present technology. Although the figures show an individual semiconductor package 100, it is understood that the package 100 may be batch processed along with a plurality of other packages 100 on a substrate panel to achieve economies of scale. The number of rows and columns of semiconductor packages 100 on the substrate panel may vary.

The substrate panel may begin with a plurality of substrates 102 (again, one such substrate 102 is shown in FIGS. 1-3). A plurality of semiconductor die may be mounted on and electrically coupled to a first surface of the substrate 102. The semiconductor die may include a controller die 104 such as an ASIC, and one or more memory die 106 and/or 108. In FIG. 2, the semiconductor package 100 may for example have an eMMC configuration including a controller 104 and non-volatile memory die 106 such as NAND utilizing an MMC (multimedia card) interface. While the controller die 104 is shown mounted to the substrate separately from the memory die 106 in FIG. 2, the controller die 104 may be mounted on top of or beneath the memory die 106 in further embodiments. Moreover, while two non-volatile memory die 106 are shown, it is understood that one or more than two non-volatile memory die 106 may be provided in further examples. In one such further embodiment, the memory die 106 may include 4, 8, 16 or 32 non-volatile memory die.

In FIG. 3, the semiconductor package 100 may for example have an eMCP configuration including a controller 104, non-volatile memory die 106 such as NAND, and a volatile memory die such as either RAM or a DRAM. While a single non-volatile memory die 106 and volatile memory die 108 are shown, the package 100 of FIG. 3 may include more than one memory die 106 and/or memory die 108. As used herein, an eMMC configuration is a semiconductor package including a controller and a non-volatile memory, and an eMCP configuration is a semiconductor package including a controller, non-volatile memory and volatile memory.

Embodiments of the semiconductor package 100 shown in FIGS. 2 and 3 include a plurality of semiconductor die. However, in further embodiments, it is conceivable that semiconductor package 100 include a single semiconductor die, such as for example a microprocessor or central processing unit chip.

The die 104, 106 (FIG. 2), and the die 104, 106, 108 (FIG. 3) are illustrated as being wire bonded to the substrate 102. However, it is understood that the die 104, 106 and/or 108 may be electrically coupled to the substrate 102 by other methods, including for example by solder bumps or having external lead frame leads which may be surface mounted to the first surface of the substrate.

The substrate 102 shown in FIGS. 1-3 may further include solder bumps 109 affixed to solder bump pads 110. In a further embodiment, it is conceivable that the solder bumps 109 be omitted so that solder bump pads 110 may be soldered directly to a host PCB. The solder bumps 109 and solder bump pads 110 may be arranged in a standard JEDEC pinout configuration, such as for example according to the eMMC 5.0 standard defining which signals are assigned to which solder bump 109. The solder bump pads 110 and solder bumps 109 may have other standard and non-standard configurations in further embodiments. The solder bumps 109 (and solder bumps 209 explained below) may at times be referred to herein as JEDEC solder bumps 109 or 209. In embodiments, an eMCP configuration may have more solder bumps that an eMMC configuration in order to interconnect the volatile memory 108 to the host PCB.

Electrical connectors in the form of contact pads, vias and/or electrical traces (not shown) within one or more layers of substrate 102 may route electrical signals between the semiconductor die and the solder bump pads 110. In one example, where the semiconductor package 100 is an eMMC configuration including a controller die 104 and non-volatile memory 106, the non-volatile memory 106 may be directly connected to the controller die 104 by the electrical connectors within the substrate 102. And the controller die 104 may be directly connected to the solder bump pads 110 by the electrical connectors within the substrate 102. In another example, where the semiconductor package 100 has an eMCP configuration including a controller die 104, non-volatile memory 106 and volatile memory 108, the non-volatile memory 106 may be routed by the electrical connectors to the controller die 104, which is in turn routed by the electrical connectors to a first subgroup of solder bump pads 110 as described above. The volatile memory 108 may in turn be routed by the electrical connectors through the substrate 102 directly to a second subgroup of solder bump pads 110.

The semiconductor package 100 may further be encapsulated within molding compound 112, which may be any of a variety of epoxy resins. The molding compound may isolate and protect the semiconductor die and other components on and within the substrate 102.

In accordance with an aspect of the present technology, the semiconductor package 100 may further include SLI contact pads 116 (some of which are numbered in the figures). In FIG. 1, the SLI contact pads 116 are shown along two opposed edges of the semiconductor package 100. However, the SLI contact pads 116 may be provided along one, two, three or around all four edges of the semiconductor package 100 in further embodiments. Additionally, one or more of the SLI contact pads 116 may instead be spaced away from edges of the package 100 in further embodiments. The pads 116 may be formed of a conductor such as copper, and plated for example in an electroplating process with a material conducive to wire bonding, such as for example soft gold.

Some or all of the SLI contact pads 116 may be electrically coupled to respective solder bump pads 110 via electrical traces 120 (some of which are numbered) routed within the substrate 102. Thus, signals from controller die 104 and volatile memory die 108 (if present) that are communicated to a given solder bump 109 are also be carried out to an associated SLI contact pad 116 via the electrical trace 120 therebetween. The semiconductor package 100 may include solder bump pads 110 which are not connected to the SLI contact pads 116 (i.e., do not have electrical traces therebetween), and vice-versa.

In embodiments, one SLI contact pad 116 may be connected by a trace 120 to one solder bump pad 110. However, it is conceivable that more than one SLI contact pad 116 may be connected to a single solder bump pad 110, and that more than one solder bump pad 110 may be connected to a single SLI contact pad 116. The particular configuration of electrical trace 120 connections shown in the figures is by way of example only and different solder bump pads 110 may be connected to different SLI contact pads 116 by traces 120 in further embodiments.

Figure 4:
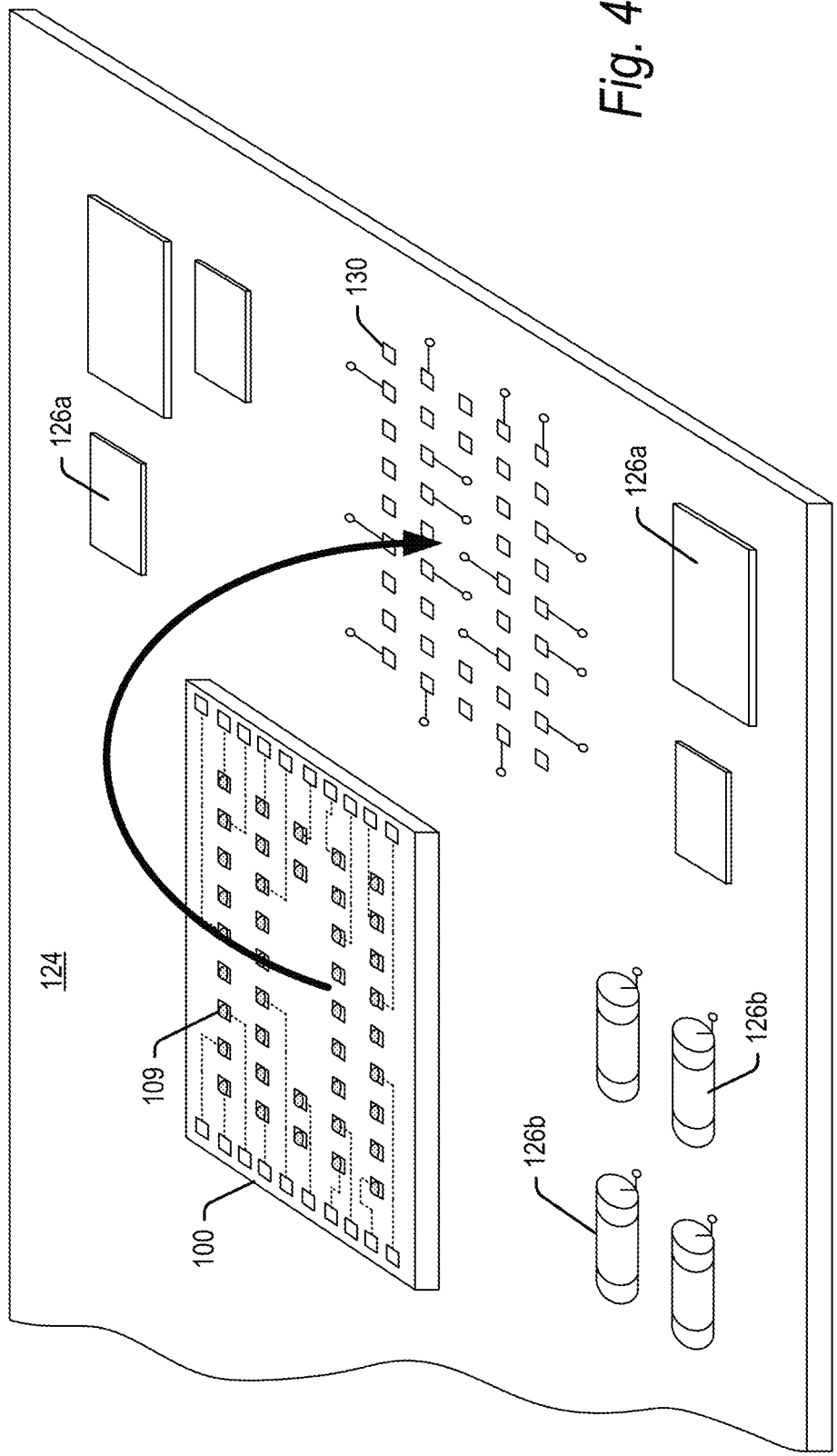
FIG. 4 is a perspective view of a semiconductor package including dual second level electrical interconnections positioned for mounting on a printed circuit board according to embodiments of the present technology.

FIG. 4 illustrates a PCB 124 of a host device. The PCB 124 (also called host PCB herein) may include a plurality of discrete components 126 including for example semiconductor die/semiconductor packages 126a and passive components 126b. The passive components may for example be one or more capacitors, resistors and/or inductors, though other components are contemplated. The number, type and position of discrete components 126 is by way of example only and may vary in further embodiments.

Host PCB 124 has a configuration enabling second level electrical interconnections with the semiconductor package 100 according to a first of two interconnection possibilities. In particular, the host PCB 124 may include bump-receiving contact pads 130 (one of which is numbered in the figures) arranged in a pattern matching that of solder bumps 109 when the semiconductor package 100 is mated with the host PCB 124. Thus, where the solder bumps 109 are arranged in a standard JEDEC configuration, the bump-receiving contact pads 130 may similarly have a standard JEDEC configuration. As noted, configurations other than the standard JEDEC configuration are contemplated.

Figure 5:
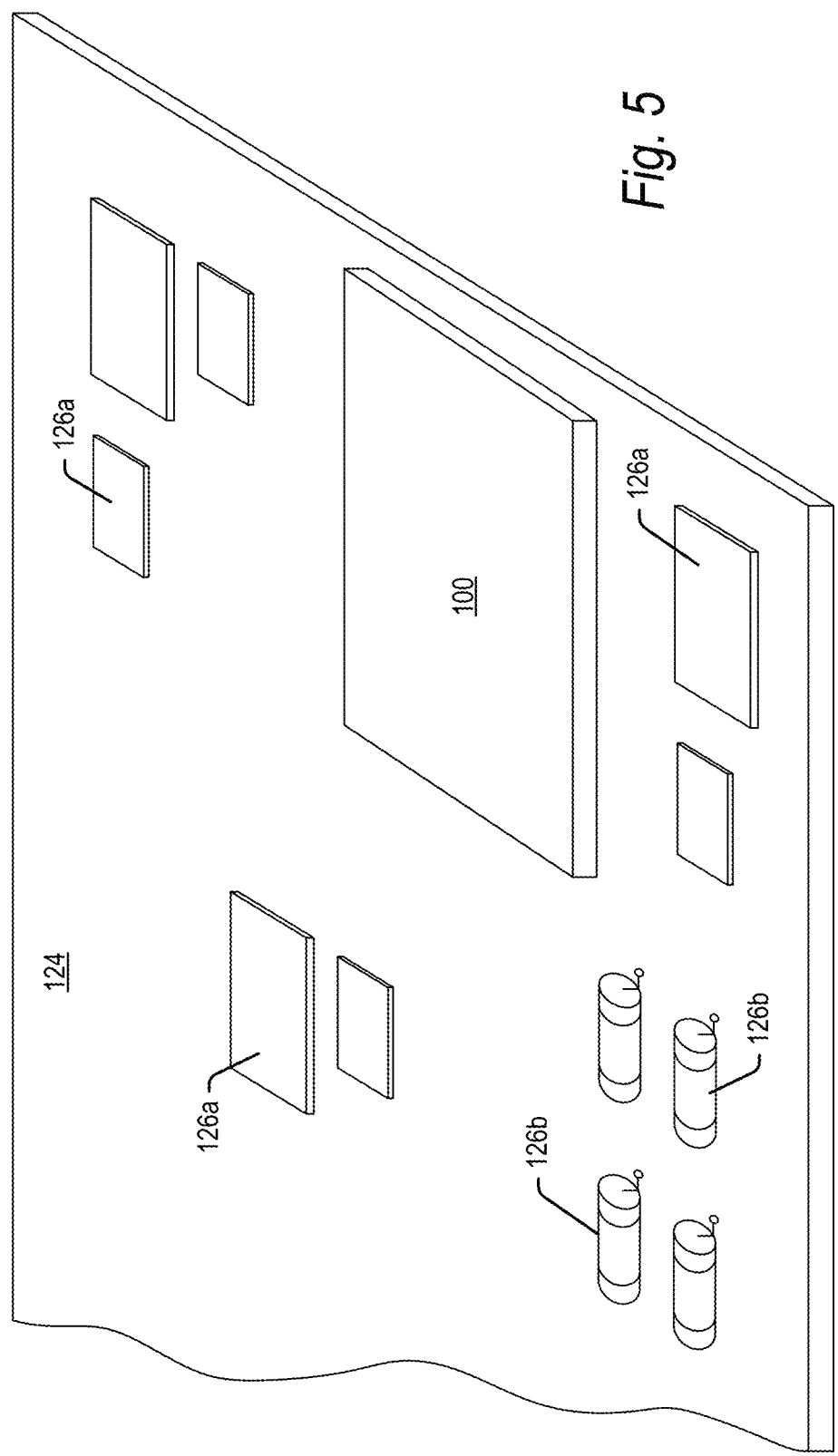
FIG. 5 is a perspective view of a semiconductor package including dual second level electrical interconnections mounted on a printed circuit board according to embodiments of the present technology.

The semiconductor package 100 may be lowered onto the host PCB 124 with the solder bumps 109 facing the surface of the PCB 124 including the bump-receiving contact pads 130 (i.e., flipped over with respect to the view of semiconductor package 100 in FIG. 4). The solder bumps 109 may mate with respective bump-receiving contact pads 130. Thereafter, the semiconductor package 100 may be physically and electrically coupled to the host PCB 124 as shown in the view of FIG. 5 in a known reflow process.

Figure 6:
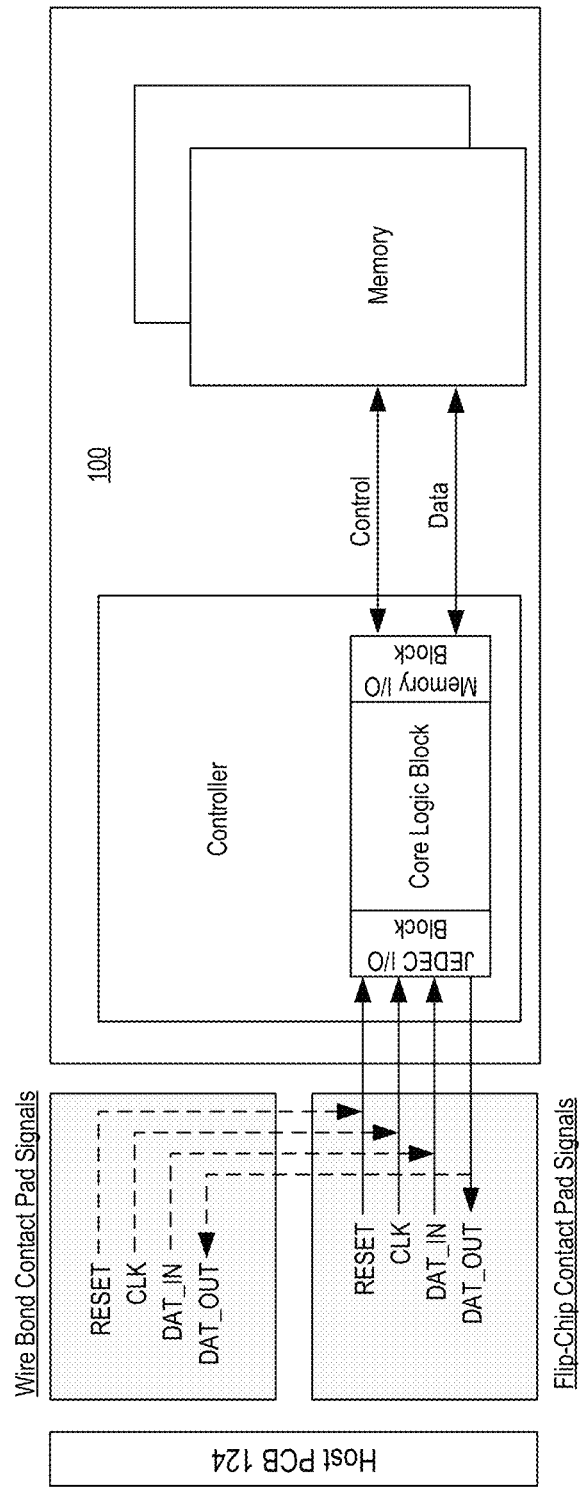
FIG. 6 is an electrical block diagram of a semiconductor package including dual second level electrical interconnections according to embodiments of the present technology.

Once affixed, signals and data may be exchanged between the host PCB 124 and the semiconductor package 100 via the solder bumps 109 and the bump-receiving contact pads 130. FIG. 6 illustrates an embodiment of a circuit block diagram of the communication of signals and data between the host PCB 124 and the semiconductor package 100 using a first of the two second level interconnection possibilities. FIG. 6 illustrates a specific example where the solder bumps are arranged in a standard JEDEC configuration. Other configurations are contemplated. Signals and data, including for example DAT_IN, DAT_OUT, CLK and RESET, may be transferred between the host PCB 124 and the semiconductor package 100 via the bump-receiving contact pads 130. In embodiments of this configuration, the wire bond contact pad signals are not used for second level interconnection between the PCB 124 and the semiconductor package 100.

Figure 7:
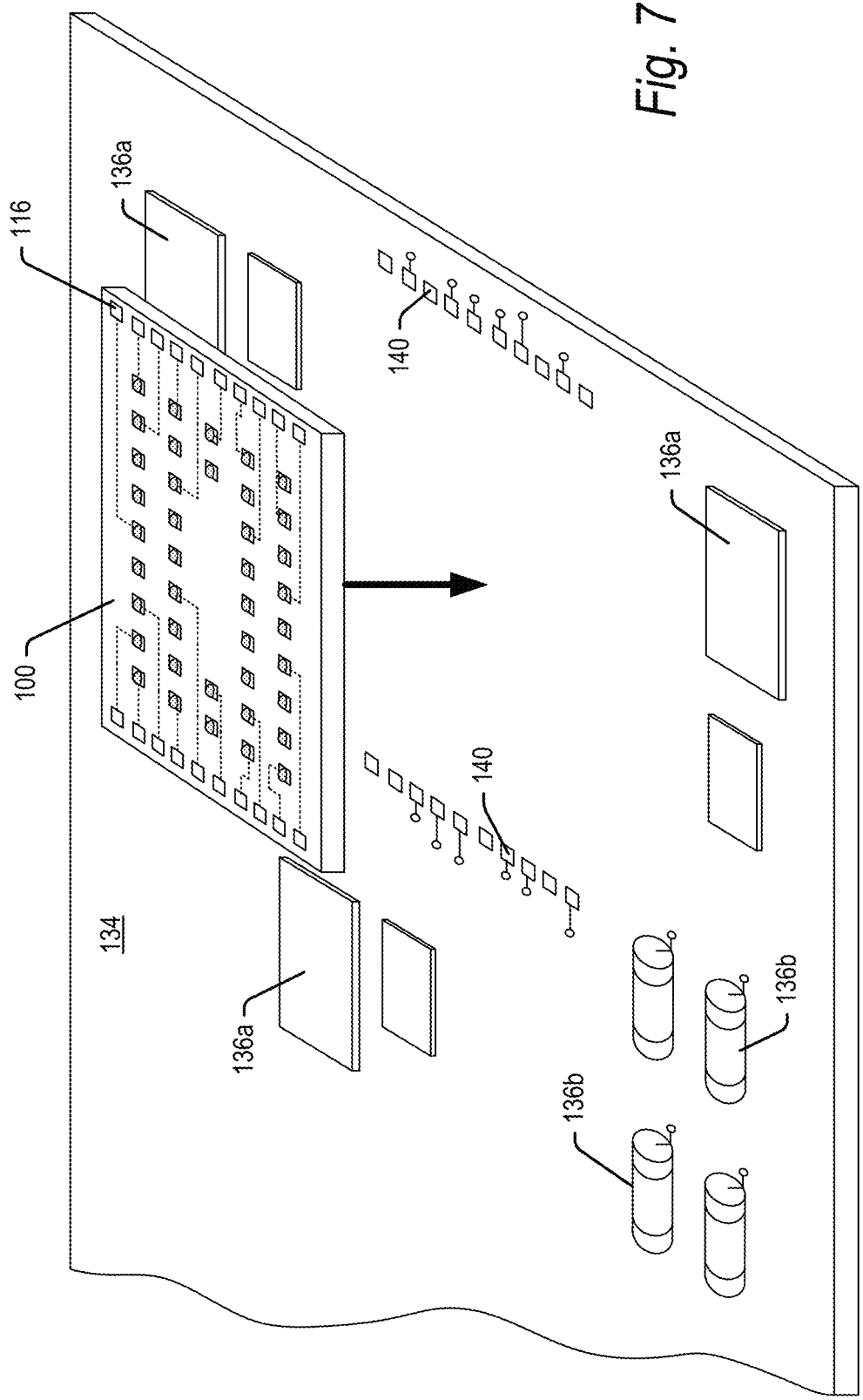
FIG. 7 is a perspective view of a semiconductor package including dual second level electrical interconnections positioned for mounting on a printed circuit board according to embodiments of the present technology.

FIG. 7 illustrates a host PCB 134 which may also be used with the semiconductor package 100. The PCB 134 may be similar to PCB 124 in that it may include a plurality of discrete components 136 including for example semiconductor die/packages 136a and passive components 136b. The number, type and position of discrete components 126 is by way of example only and may vary in further embodiments.

The host PCB 134 differs from PCB 124 in that it has a configuration enabling second level interconnections with the semiconductor package 100 according to the second of two interconnection possibilities. In particular, the host PCB 134 may include wire bond contact pads 140 (two of which are numbered in the figures) for wire bonding the semiconductor package 100. The functionality of a given wire bond contact pad 140 (i.e., the signals/data it carries) is customized for the SLI contact pad 116 to which it will be electrically connected as explained below.

In embodiments, the semiconductor package 100 may be lowered onto the host PCB 134 and affixed thereto with an adhesive. The adhesive may for example be a thermally conductive adhesive, though it need not be in further embodiments. As the surface of the semiconductor package that is brought into contact with the host PCB 134 is covered with molding compound 112, electrical shorting between the semiconductor package 100 and PCB 134 is prevented.

Figure 8:
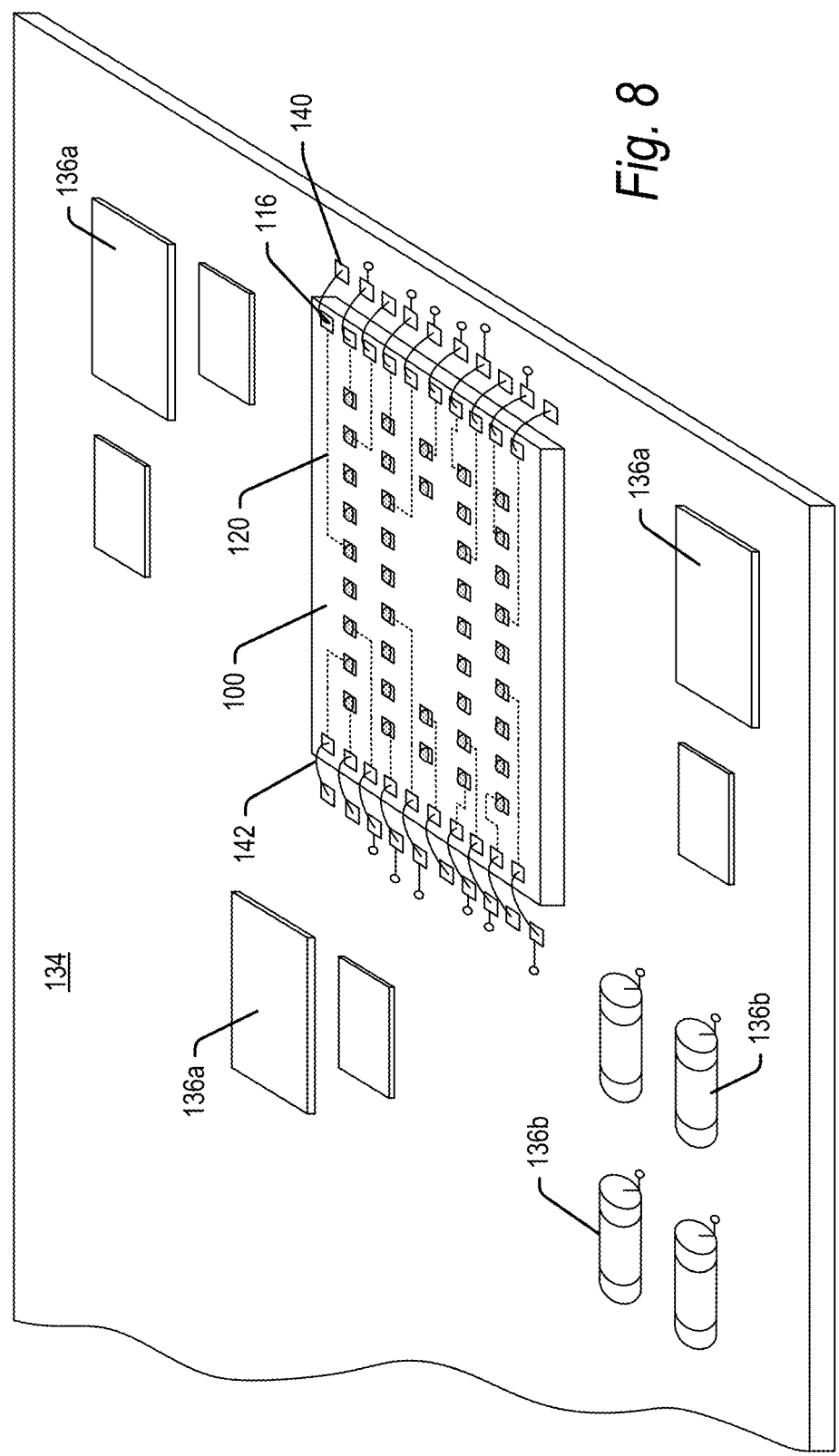
FIG. 8 is a perspective view of a semiconductor package including dual second level electrical interconnections mounted on a printed circuit board according to embodiments of the present technology.

Thereafter, as shown in FIG. 8, the semiconductor package 100 may be electrically coupled to the host PCB 134 via wire bonds 142 (one of which is numbered in the figures). In particular, the SLI contact pads 116 of semiconductor package 100 may be wire bonded to respective ones of wire bond contact pads 140 on the host PCB 134 via wire bonds 142 using a wire bonding capillary in a known wire bond process.

Figure 9:
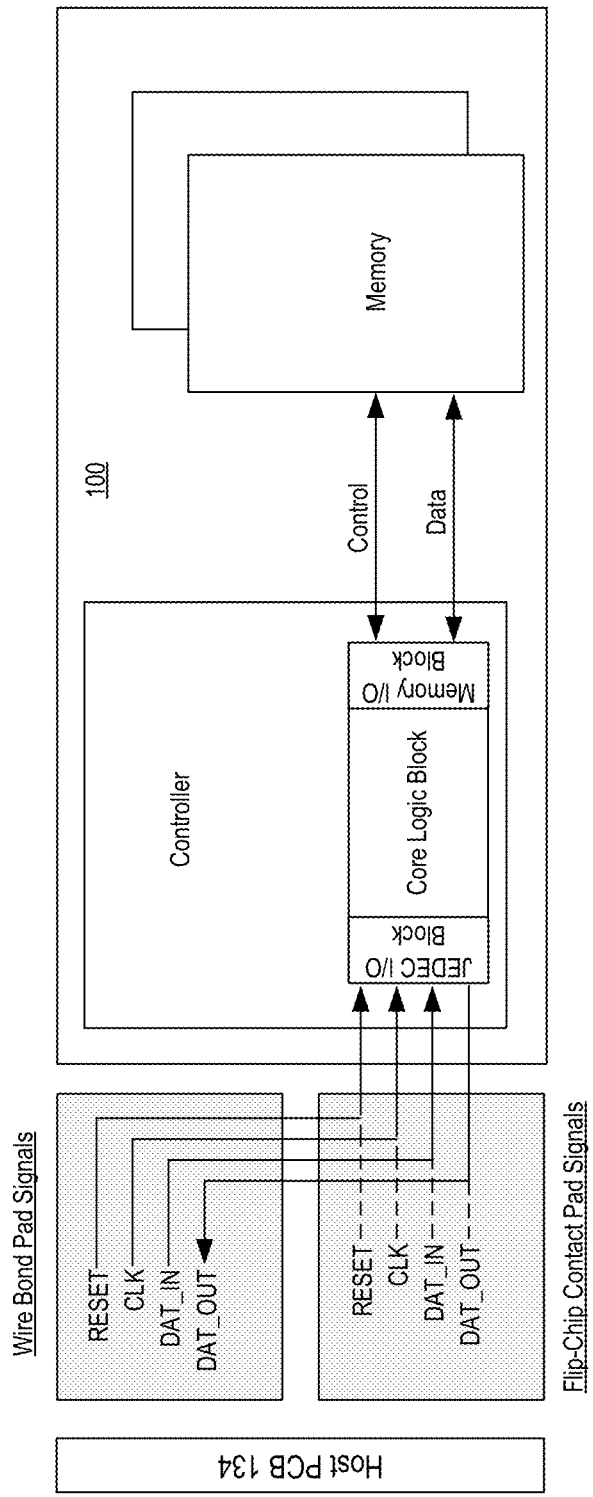
FIG. 9 is an electrical block diagram of a semiconductor package including dual second level electrical interconnections according to embodiments of the present technology.

Once affixed, signals and data may be exchanged between the host PCB 134 and the semiconductor package 100 via the SLI contact pads 116, wire bonds 142 and wire bond contact pads 140. FIG. 9 illustrates an embodiment of a circuit block diagram of the communication of signals and data between the host PCB 134 and the semiconductor package 100 using the second of two second level interconnection possibilities. FIG. 9 illustrates a specific example where the solder bumps are arranged in a standard JEDEC configuration, though it need not be in further embodiments. Signals and data, including for example DAT_IN, DAT_OUT, CLK and RESET may be transferred between the host PCB 134 and the semiconductor package 100 via the wire bond pads 140, wire bonds 142 and the SLI contact pads 116. In embodiments of this configuration, the bump-receiving contact pad signals are not used for second level interconnection between the PCB 123 and the semiconductor package 100.

It can be seen that the configuration of the semiconductor package 100 in accordance with the present technology provides dual second level electrical interconnection possibilities, and enhanced flexibility with respect to the type of host PCB to which it may be affixed. As discussed above and shown in FIGS. 4-9, the semiconductor package 100 may be used with host PCBs configured to receive a solder bump semiconductor package, or alternatively host PCBs configured to receive a wire bonded semiconductor package. This also reduces the number of different types of semiconductor packages which need to be produced. That is, where two different types of semiconductor packages were required for two different configurations of host PCBs (one configured for solder bump connection and another for wire bonding), the present technology allows a single configuration of a semiconductor package to be used on the two different types of host PCBs.

In addition to the above-described advantages, the semiconductor package 100 in accordance with the present technology further increases flexibility with respect to where it may be mounted on a host PCB, and potentially allows for a reduction in the footprint of the host PCB. In particular, when utilized in a wire bonded second level interconnect configuration, the surface of semiconductor package 100 in contact with the host PCB 134 is covered in molding compound 112 and is electrically inactive. As such, it may be mounted on top of discrete components already affixed to the host PCB 134. Thus, separate space for semiconductor package 100 need not be reserved on host PCB 134.

Figure 10:
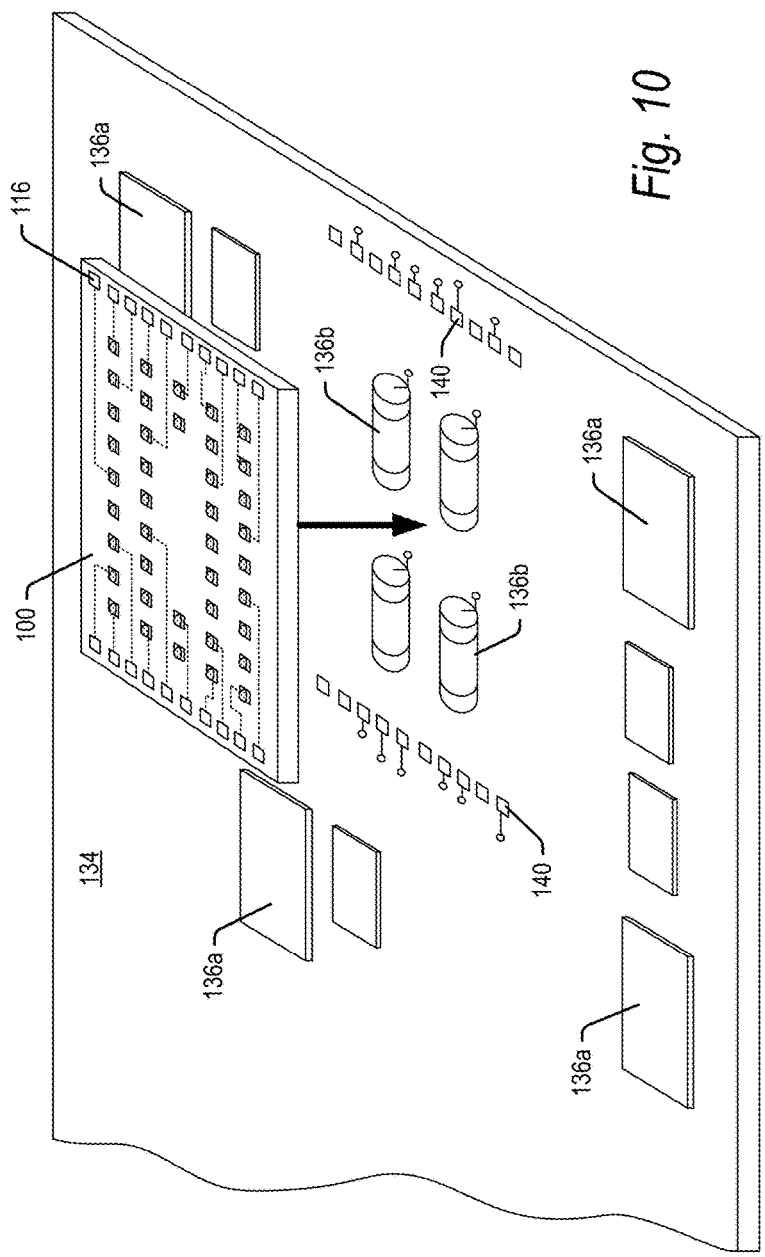
FIG. 10 is a perspective view of a semiconductor package including dual second level electrical interconnections positioned for mounting on a printed circuit board according to embodiments of the present technology.
Figure 11:
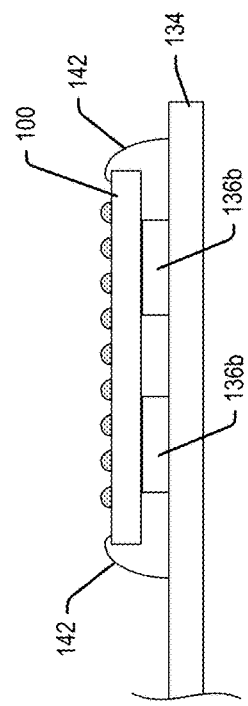
FIG. 11 is a side view of a semiconductor package including dual second level electrical interconnections mounted on a printed circuit board according to embodiments of the present technology.

For example, as shown in FIGS. 10-11, a semiconductor package 100 may be affixed to the host PCB 134 on top of passive components 136b, and then wire bonded to wire bond contact pads 140. In further embodiments, support posts (not shown) may be mounted on the host PCB 134, and the semiconductor package 100 may be mounted on top of the support posts, to support the semiconductor package 100 over discrete components on the host PCB 134.

In a further example shown in FIGS. 12-13, the semiconductor package 100 may be affixed to the host PCB 134 on top of one or more semiconductor die or one or more semiconductor packages 136a. The die/package 136a may be electrically coupled to the host PCB 134 by solder bumps (as shown), wire bonds or surface mounting. As noted, semiconductor package 100 may be mounted on the die/package 136a using an adhesive 146, which may for example be a thermal conductor. In embodiments, a heat sink (not shown) may also be used at the interface between the semiconductor package 100 and the die/package 136a on which the package 100 is mounted.

In one example of the embodiment of FIGS. 10 and 11, the semiconductor package 136a on which the semiconductor package 100 is mounted may itself be a semiconductor package 100 in accordance with the present technology. In such an embodiment, the host PCB may include both bump-receiving contact pads 130 (as shown in FIG. 4) and wire bond contact pads 140 (as shown in FIG. 7). A first semiconductor package 100 may be electrically coupled to the host PCB using the solder bump second level electrical interconnections as described above. Thereafter, a second semiconductor package 100 may be mounted with an adhesive 146 on top of the first semiconductor package 100 (with the encapsulated surfaces facing each other). Then, the second semiconductor package 100 may be electrically coupled to the host PCB using the wire bond second level electrical interconnections as described above. This embodiment effectively doubles the storage capacity by using two semiconductor packages 100 without appreciably changing the footprint required on the host PCB.

Figure 16:
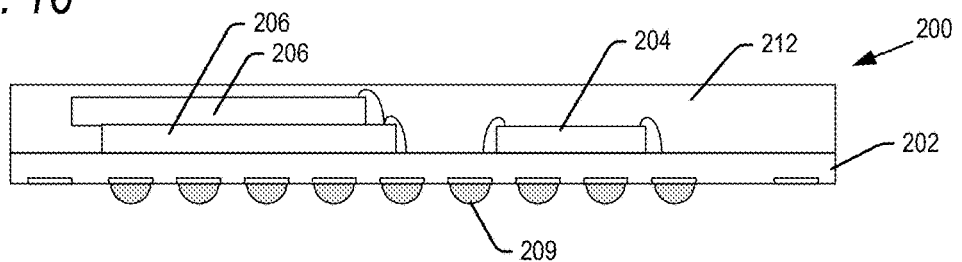
FIGS. 16 and 17 are side views of alternative embodiments of the semiconductor package shown in FIG. 14.
Figure 17:
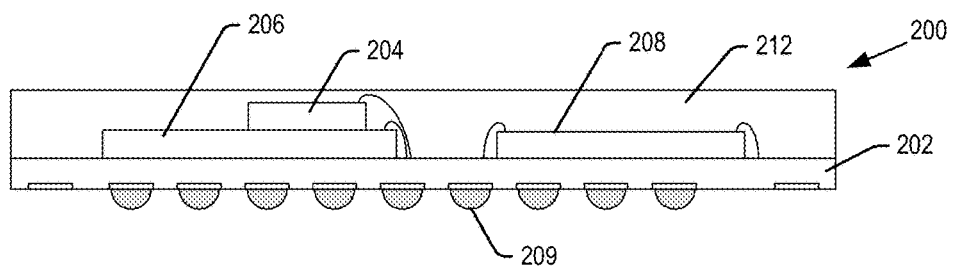

FIGS. 14-29 illustrate a further embodiment of the present technology. Referring initially to FIGS. 14-17, there is shown a semiconductor package 200 which is similar in some respects to the semiconductor package 100 described above. Package 200 may be an eMMC configuration as shown in FIG. 16 including a controller die 204 and non-volatile memory die 206 such as NAND. The semiconductor package 200 may be an eMCP configuration as shown in FIG. 17 including a controller 104, non-volatile memory die 206 such as NAND, and a volatile memory die such as either a RAM or a DRAM. As in the embodiments described above, the number and position of memory die 206 and/or 208 may vary. The die 204, 206 (FIG. 16), and the die 204, 206, 208 (FIG. 17) are illustrated as being wire bonded to the substrate 202. However, it is understood that the die 204, 206 and/or 208 may be electrically coupled to the substrate 202 by other methods, including for example by solder bump mounting or having external lead frame leads which are surface mounted to the first surface of the substrate.

The substrate 202 shown in FIGS. 14-17 may further include solder bumps 209 affixed to solder bump pads 210. The solder bumps 209 and solder bump pads 210 may be arranged in a standard JEDEC pinout configuration, for example according to the eMMC standard, though they may have other standard and non-standard configurations in further embodiments. Electrical connectors such as vias, electrical traces and/or contact pads (not shown) within one or more layers of substrate 202 may route electrical signals between the semiconductor die and the solder bump pads 210. In an example of an eMMC configuration, the non-volatile memory 206 may be directly connected to the controller die 204, and the controller die 204 may be directly connected to the solder bump pads 210. In an example of an eMCP configuration, the non-volatile memory 206 may be directly connected to the controller die 204, and the controller die 204 may be directly connected to a first subgroup of the solder bump pads 210. Additionally, the volatile memory 208 may be directly connected to a second subgroup of solder bump pads 210. As used in connection with this embodiment (and possibly other embodiments described herein), the term "directly connected to" refers to an electrical connection between two components via the electrical connectors in the substrate (the contact pads, vias and/or traces), and not through another semiconductor die. As with semiconductor package 100, the semiconductor package 200 may be encapsulated within molding compound 212.

Figure 14:
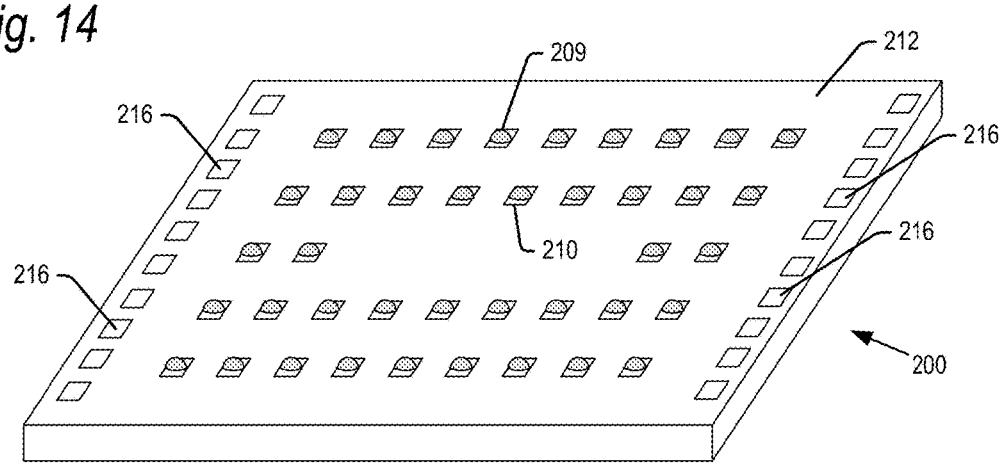
FIG. 14 is a bottom perspective view of a semiconductor package including reclaim pads for reclaim of the semiconductor package according to embodiments of the present technology.
Figure 15:
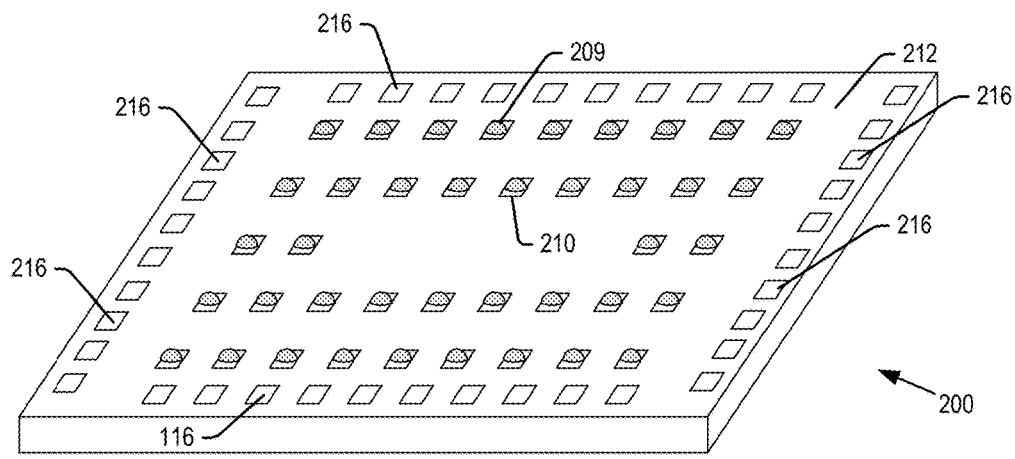
FIG. 15 is a bottom perspective view of a semiconductor package including reclaim pads for reclaim of the semiconductor package according to an alternative embodiment of the present technology.

As seen for example in FIGS. 14 and 15, the semiconductor package 200 may further include reclaim pads 216 (some of which are numbered in the figures). In embodiments of package 200 including non-volatile memory 206, a first subgroup of some of the reclaim pads 216 may be wired directly to the non-volatile memory die 206, bypassing the controller die 204, via the electrical connectors routed within the substrate 202.

It is known to provide test pads on a surface of a semiconductor package, routed directly to the non-volatile memory, for testing the read/write functionality of the non-volatile memory during the semiconductor device fabrication. During such tests, a test probe (not shown) may connect with the test pads to write data to and/or read data from the non-volatile memory die directly, bypassing the controller die. In embodiments, the first subgroup of at least some of the reclaim pads 216 may be these test pads directly connected to the non-volatile memory 206. The reclaim pads 216 need not be the above-described test pads in further embodiments. In examples of package 200 also including volatile memory 208, a second subgroup of some of the reclaim pads 216 may be wired directly to the volatile memory die 208 via the electrical connectors routed within the substrate 202.

The reclaim pads 216 may be provided adjacent one edge, a two edges (FIG. 14), three edges, or all four edges (FIG. 15). FIGS. 18-20 and 23-29 show reclaim pads 216 at two or four edges, but it is understood that the embodiments of FIGS. 18-20 and 23-29 may also operate with reclaim pads 216 at one, two, three or four edges of the semiconductor die 200. In further embodiments, one or more of the reclaim pads 216 may instead be spaced away from edges of the package 200 in further embodiments. The pads 216 may be formed of a conductor such as copper, and plated for example in an electroplating process with a material conducive to wire bonding, such as for example soft gold.

Once semiconductor package 200 is assembled, it may turn out that one or more of the semiconductor die 204, 206 and/or 208 are faulty. Conventionally, this may have resulted in the entire package being discarded. In accordance with aspects of the present technology, one or more of the semiconductor die 204, 206 and/or 208 may still be utilized when another of the semiconductor die 204, 206 and/or 208 is faulty. Moreover, the reclaiming of one or more die according to the present technology is communication protocol agnostic. That is, a semiconductor package 200 configured according to a first communication protocol, for example an eMMC configuration including an eMMC interface, may be reclaimed into a memory device configured according to a second, different protocol, for example into a USB flash memory drive, without an additional bridge semiconductor chip conventionally used to convert between different protocols.

Figure 18:
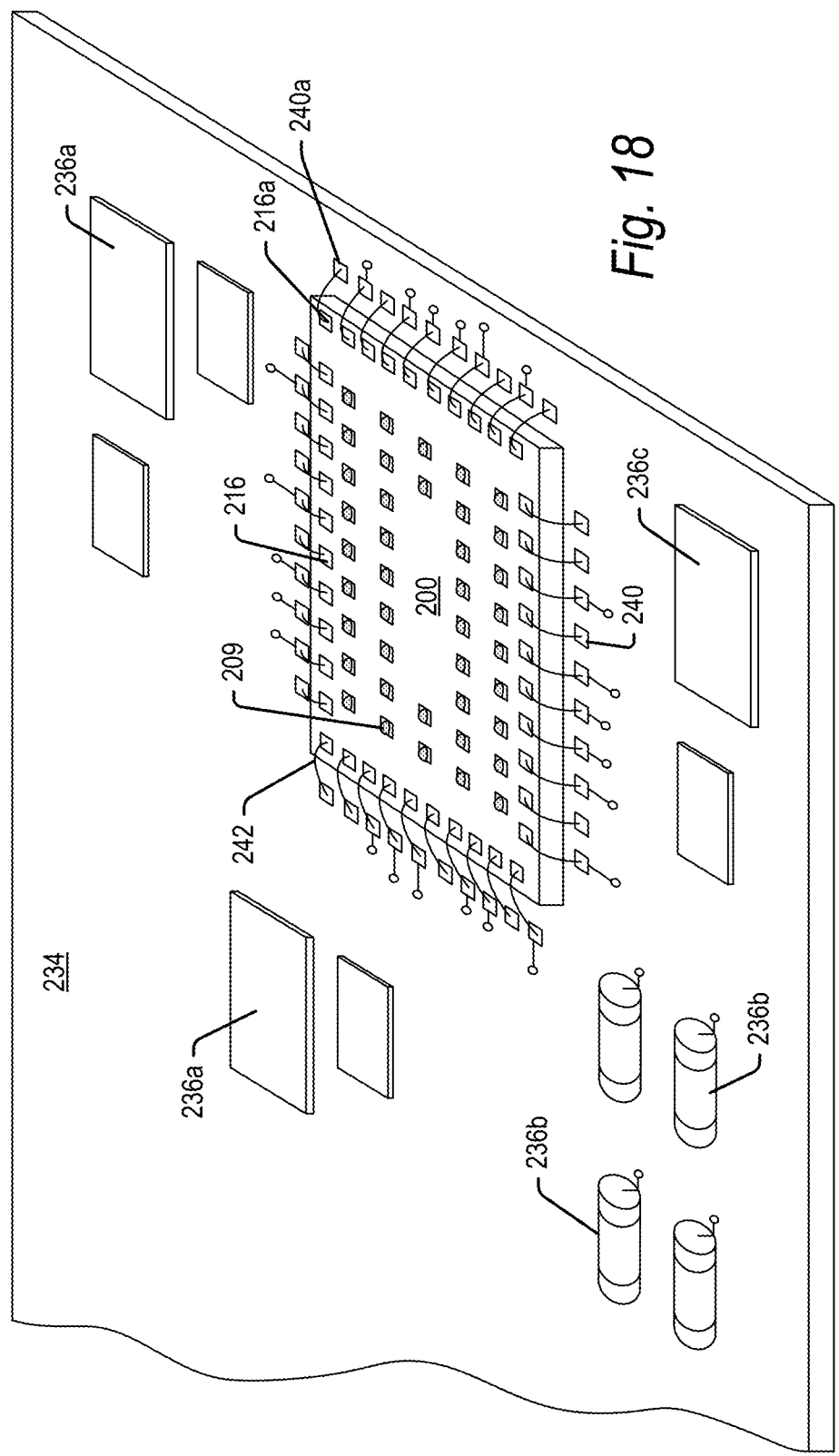
FIG. 18 is a perspective view of a semiconductor package including reclaim pads mounted on a printed circuit board according to embodiments of the present technology.

Referring now to FIG. 18, as one example, it may happen for example that after fabrication of an eMCP configuration semiconductor package 200 including a controller die 204, non-volatile memory 206 and volatile memory 208, it turns out that the controller die 204 is faulty. In such an instance, the memory die 206 and/or 208 (or however many memory die are within package 200) may be reclaimed by affixing the package 200 to a host PCB 234 with the solder bumps 209 and reclaim pads 216 facing up away from the host PCB 234. Thereafter, wire bonds 242 may be formed between reclaim pads 216 and wire bond contact pads 240 on the substrate 202 as shown in FIG. 18.

Figure 19:
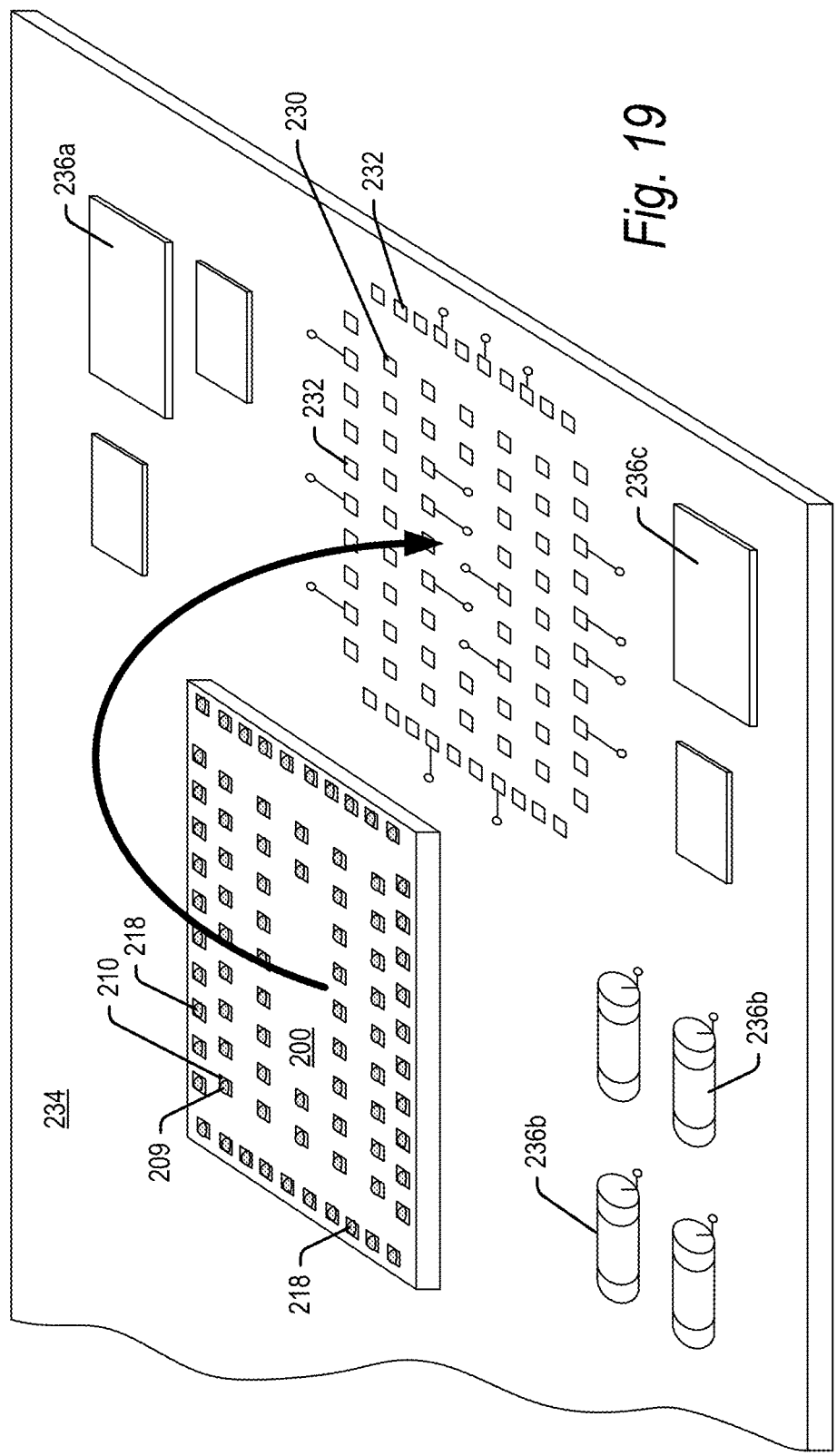
FIG. 19 is a perspective view of a semiconductor package including reclaim pads positioned for mounting on a printed circuit board according to an alternative embodiment of the present technology.
Figure 20:
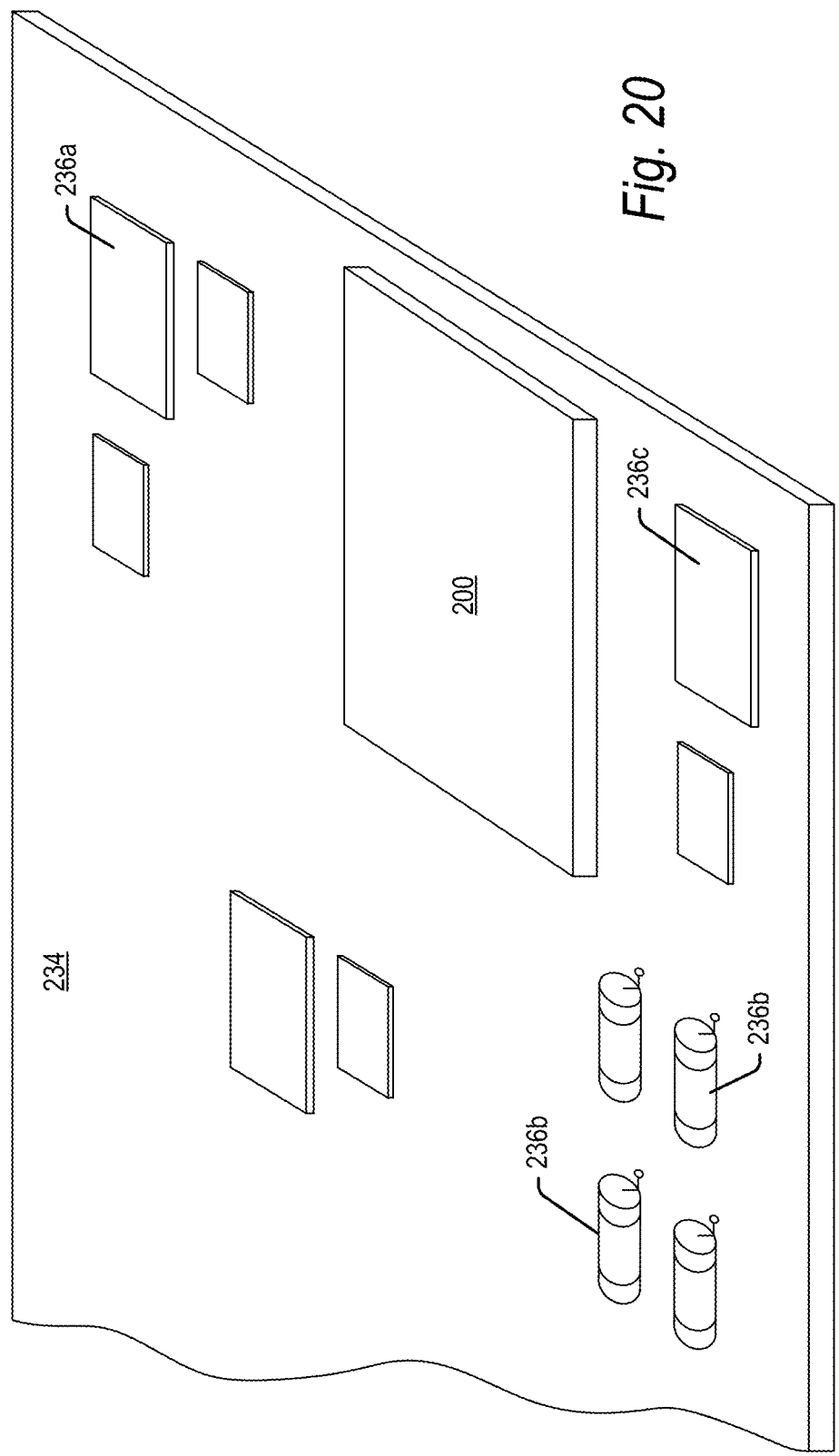
FIG. 20 is a perspective view of a semiconductor package including reclaim pads mounted on a printed circuit board according to an alternative embodiment of the present technology.

Instead of wire bonding, the semiconductor package 200 of the reclaim embodiment may be mounted via solder bumps 218 provided on the reclaim pads 216 as shown in FIGS. 19 and 20. A corresponding pattern of bump-receiving contact pads 232 may be formed on the host PCB 234. Thereafter, the semiconductor package 200 may be flipped over from the position shown in FIG. 19, and the solder bumps 218 may be physically and electrically connected to the bump-receiving contact pads 232 in a known reflow process to electrically connect the reclaim pads 216 to the host PCB 234 (FIG. 20). In this embodiment, the solder bumps 209 on the JEDEC solder bump pads 210 may or may not be omitted. If not omitted, the solder bumps 209 may bond to the JEDEC bump-receiving contact pads 230 during the reflow process. However, the controller 204 and JEDEC solder bump pads 210 connected to the controller 204 may be deactivated in the reclaim embodiment by grounding an SD_RESET signal pin. This feature is explained in greater detail below.

In one embodiment, some of the reclaim pads 216 have a direct connection to the non-volatile memory 206, and others of the reclaim pads 216 have a direct connection by the electrical connectors in the substrate to the volatile memory 208. Alternatively, the reclaim pads 216 may have a direct connection to the non-volatile memory 206 and not volatile memory 208, or vice-versa. In any of these embodiments, once the reclaim pads 216 are electrically connected to the host PCB 234, the host PCB 234 may directly access and utilize the non-volatile memory 206 and/or volatile memory 208 within semiconductor package 200 via the reclaim pads 216, bypassing the faulty controller die 204 within the package 200. A controller mounted on the host PCB 234, for example controller 236c, may be used to access the memories 206 and/or 208. As noted above, as the host PCB is accessing the protocol-agnostic memories 206 and/or 208 directly, the host PCB may operate according to communication protocols other than that to which the semiconductor package 200 was originally configured.

In addition to the reclaim pads 216, the volatile memory 206 may be electrically connected within the semiconductor package 200 to the controller die 204. Accordingly, in embodiments, the controller die 204 may be deactivated to prevent noise during memory die 206 access by the host PCB 234 (even though there may be no connection between the solder bumps 209 or controller die 204 and the host PCB 234). One of the reclaim pads 216, for example reclaim pad 216a in FIG. 18, may carry an SD_RESET signal between the controller die 204 and the memory die 206. The SD_RESET signal on reclaim pad 216a may be connected to a grounded wire bond contact pad 240a (FIG. 18). Grounding the SD_RESET signal effectively floats, or deactivates, the controller die 204 within the semiconductor package 200.

Figure 21:
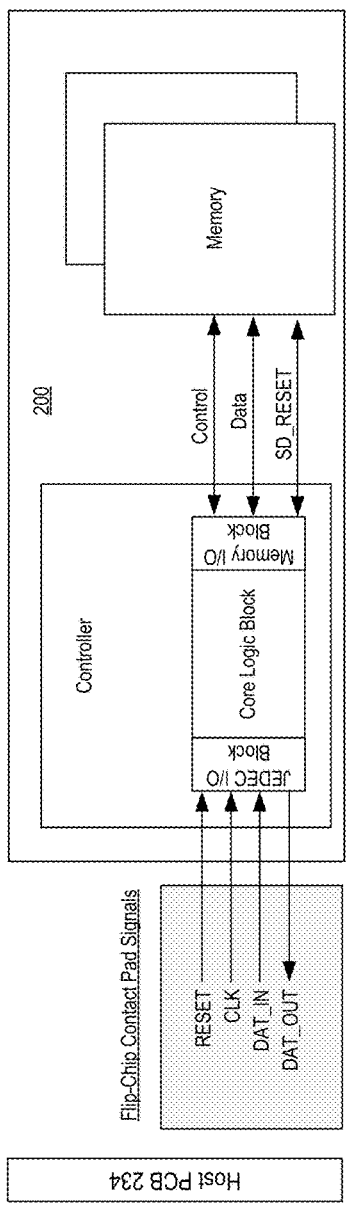
FIGS. 21 and 22 are electrical block diagrams of a semiconductor package including reclaim pads according to embodiments of the present technology.
Figure 22:
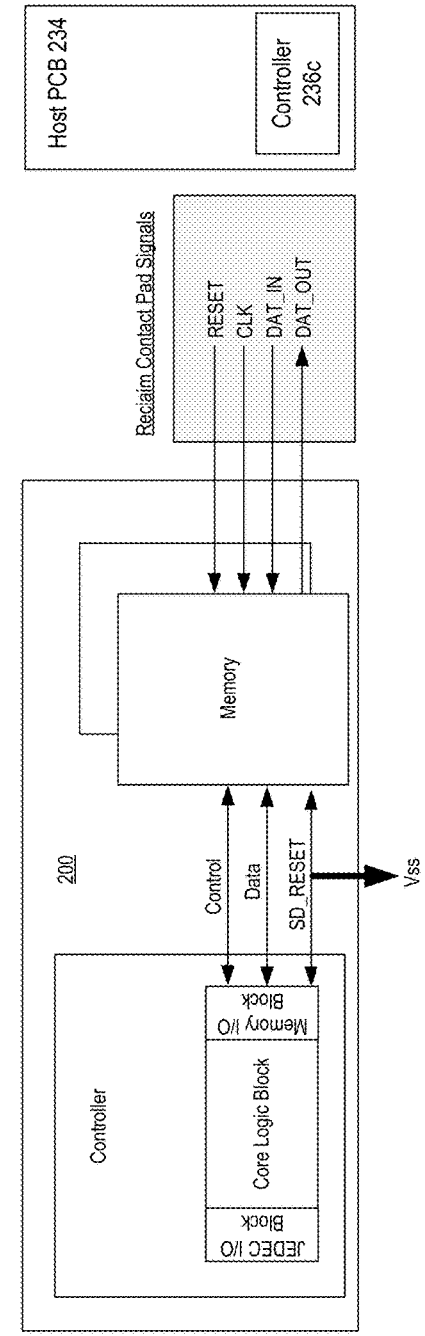

FIGS. 21 and 22 are electrical block diagrams illustrating a conventionally operating semiconductor package 200, and a reclaimed semiconductor package of FIG. 18, respectively. In FIG. 21, the semiconductor package is mounted onto the host PCB 234 via the conventional solder bumps 209, and signals and data are exchanged between the controller die 204 of package 200 and the host PCB 234 via the bumps 209 and bump-receiving contact pads 230.

However, where the controller die 204 is faulty, the memory die 206 and/or 208 may be reclaimed as shown in FIG. 22. The reclaim pads 216 may be electrically connected to the host PCB 234. Additionally, the SD_RESET signal may be communicated to a reclaim pad 216a which may be wire bonded (FIG. 18) or solder bump connected (FIGS. 19 and 20) to ground, Vss, on the host PCB 234 to floats the controller die 204. Thereafter, the memory die 206 and/or 208 may be directly accessed by the controller 236c mounted to the host PCB 234.

The above description of FIGS. 18-22 may also apply to an embodiment where the semiconductor package 200 is provided in an eMMC configuration to reclaim the non-volatile memory 206 where the controller die 204 is faulty. In such a package, the reclaim pads 216 may be used to directly connect the non-volatile memory die 206 to the controller 236c on the host PCB 234, bypassing the controller die 204 within package 200. The SD_RESET signal may be grounded as described above.

The above description of FIGS. 18 and 21-22 may also apply to an embodiment where the semiconductor package 200 is provided in an eMCP configuration to reclaim the non-volatile memory 206 where the volatile memory 208 is faulty. In such a package, the reclaim pads 216 may be used to wire bond the non-volatile memory die 206 to the controller 236c on the host PCB 234, bypassing the controller die 204 within package 200. The SD_RESET signal may be grounded as described above. The reclaim pads 216 connected to the volatile memory need not be connected to the host PCB 234.

The above description of FIGS. 18 and 21-22 may also apply to an embodiment where the semiconductor package 200 is provided in an eMCP configuration to reclaim the volatile memory 208 where the non-volatile memory 206 is faulty. In such a package, the reclaim pads 216 may be used to wire bond the volatile memory die 208 to the controller 236c on the host PCB 234. The reclaim pads 216 connected to the non-volatile memory need not be connected to the host PCB 234. As the volatile memory 208 may not be connected through the controller die 204, the SD_RESET signal need not be grounded in this embodiment, though it may be.

Figure 23:
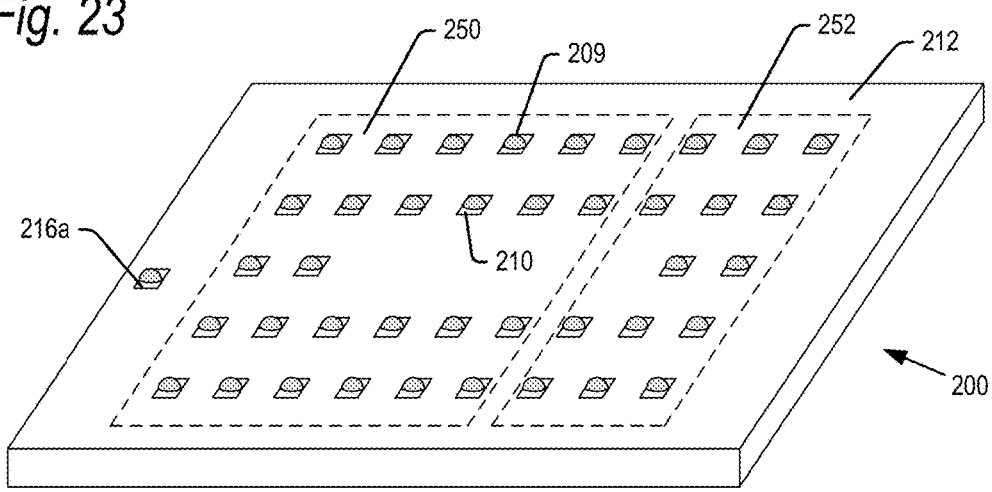
FIGS. 23-25 are perspective views of alternative embodiments of a semiconductor package including reclaim pads for reclaiming volatile semiconductor die.
Figure 24:
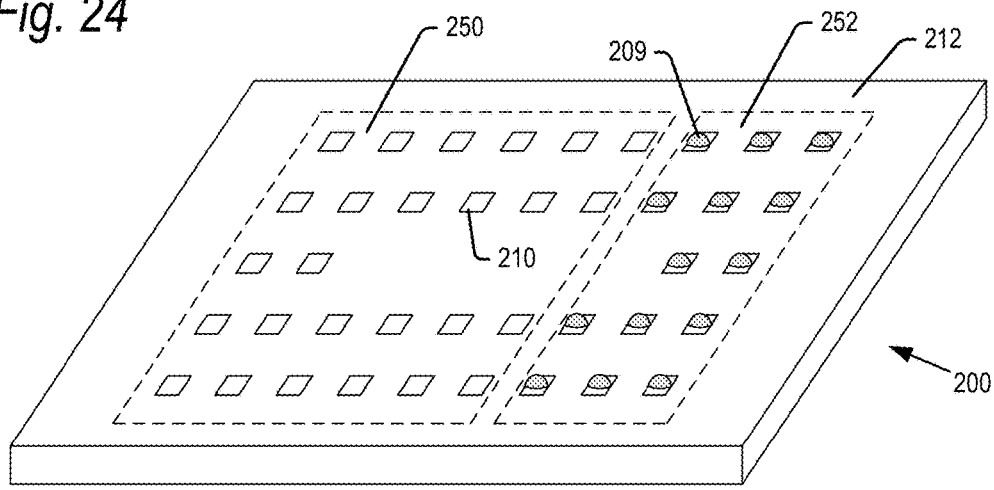
Figure 25:
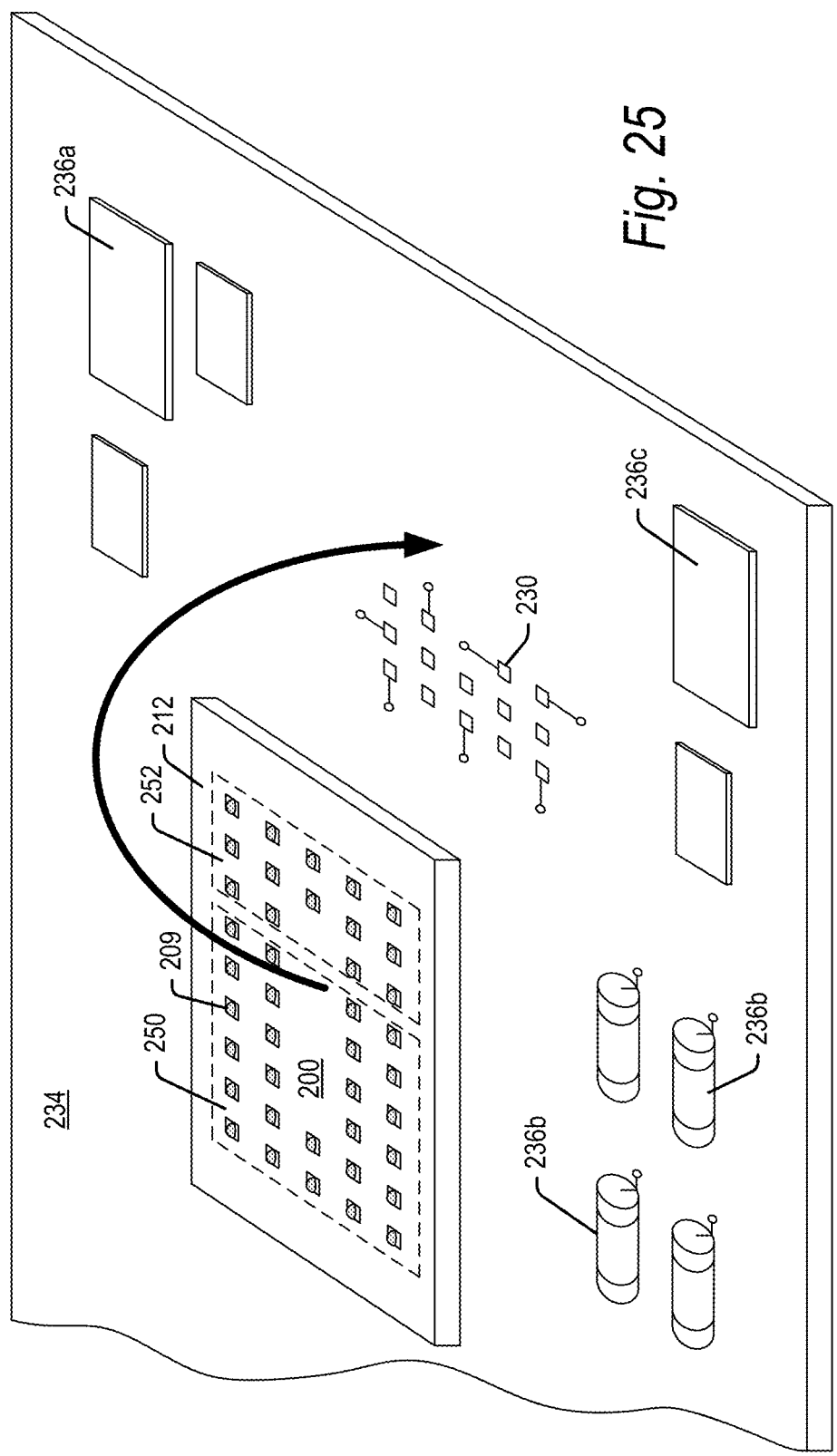

FIGS. 23-25 illustrate a further embodiment for reclaiming volatile memory 208 when either the controller die 204 and/or non-volatile memory 206 is faulty. As noted above, in eMCP configurations, a first subgroup of the JEDEC solder bumps 209 may be connected to the controller die 204 (first subgroup 250 in FIG. 23). A second subgroup of the JEDEC solder bumps 209 may be connected to the volatile memory 208 (second subgroup 252 in FIG. 23). It is understood that the particular grouping of the first and second subgroups 250, 252 in FIGS. 23-25 is by way of example only and may vary in further embodiments.

In one embodiment, to reclaim the volatile memory die 208 within package 200, the package 200 may be mounted to the host PCB 234 via solder bumps as described above. In this embodiment, both the first and second subgroups of solder bumps will be physically and electrically coupled to the bump-receiving contact pads on the host PCB 234. In order to prevent any signal/data transfer to or from the controller die 204 (to or from the first subgroup 250 of solder bumps), the reclaim pad 216a connected to the SD_RESET signal may have a solder bump which gets mounted to a ground contact pad on the host PCB 234 to float the controller die 204. Others of the reclaim pads 216 need not be connected to the host PCB 234, and may or may not be omitted.

In a further embodiment shown in FIG. 24, the solder bumps from the first subgroup 250 may be removed from (or never applied to) the semiconductor package 200. In this embodiment, to reclaim the volatile memory die 208 within package 200, the package 200 may be mounted to the host PCB 234 via solder bumps as described above. As there are no solder bumps in the first subgroup 250, only the second subgroup 252 of solder bumps are connected to the host PCB 234 and capable of carrying signals between the volatile memory 208 and the host PCB 234. Reclaim pads 216 need not be connected to the host PCB 234, and may or may not be omitted.

In a further embodiment shown in FIG. 25, the semiconductor package 200 may include the first and second subgroups 250, 252 of solder bumps, but the host PCB 234 may be configured with bump-receiving contact pads 230 that only mate with the second subgroup 252 of solder bumps. Alternatively, the host PCB 234 may also include bump-receiving contact pads 230 that mate with the solder bumps in the first group 250, but these bump-receiving contact pads 230 are not connected anywhere (electrically isolated) with the PCB 234 or are otherwise inactive. In this embodiment, to reclaim the volatile memory die 208 within package 200, the package 200 may be mounted to the host PCB 234 via solder bumps as described above. As there are no signals to/from the solder bumps in the first subgroup 250, only the second subgroup 252 of solder bumps are connected to the host PCB 234 and capable of carrying signals between the volatile memory 208 and the host PCB 234. Reclaim pads 216 need not be connected to the host PCB 234, and may or may not be omitted.

The reclaim embodiments described above for example with respect to FIGS. 23-25 relate to reclaiming a semiconductor package by attaching at least a subgroup of solder bumps of the semiconductor package to the host PCB. In further embodiments, the interconnection method need not be solder bumps, but can alternatively or additionally use wire bonds between contact pads on the semiconductor package and contact pads on the host PCB.

Thus, it can be seen that the configuration of the semiconductor package 200 in accordance with the present technology provides increased flexibility to allow reclaim of working memory die when other memory die and/or the controller die are faulty. Moreover, the present technology provides this reclaim ability in a communication protocol agnostic manner. Embodiments described above are used upon one or more of the die in the semiconductor package being found faulty. However, embodiments described above may also be used for flexibility to manage inventory. In such instances, all die in the semiconductor package may be functioning properly.

Figure 26:
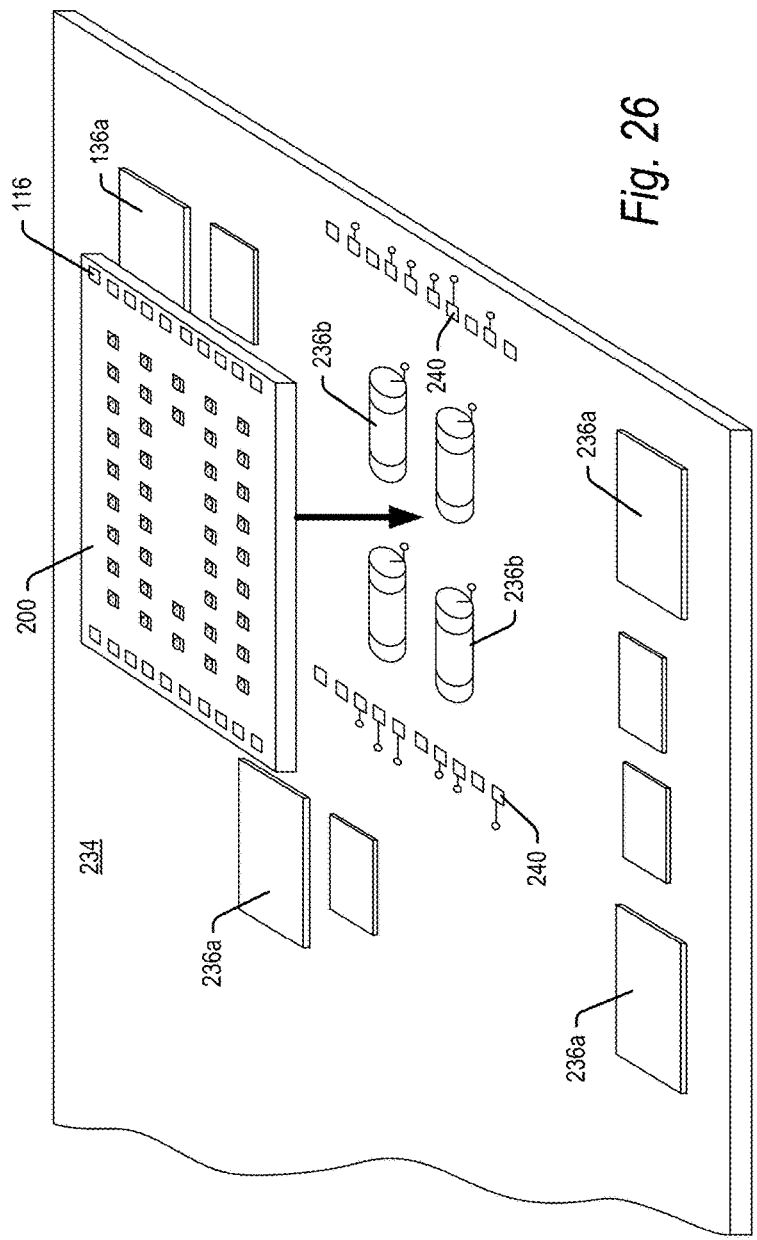
FIG. 26 is a perspective view of a semiconductor package including reclaim pads positioned for mounting on a printed circuit board according to embodiments of the present technology.
Figure 27:
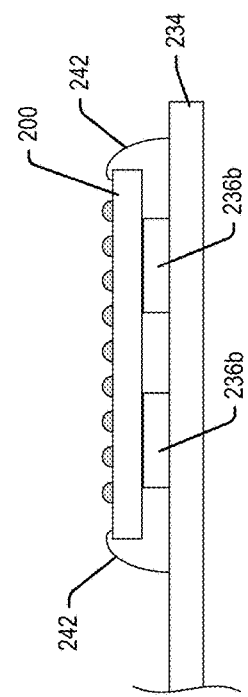
FIG. 27 is a side view of a semiconductor package including reclaim pads mounted on a printed circuit board according to embodiments of the present technology.

In addition to the above-described advantages, the semiconductor package 200 in accordance with the present technology further increases flexibility with respect to where it may be mounted on a host PCB, and potentially allows for a reduction in the footprint of the host PCB. For example, as shown in FIGS. 26-27, a semiconductor package 200 may be affixed to the host PCB 234 on top of passive components 236*b*, and then wire bonded to electrically couple the reclaim pads 216 to the wire bond contact pads 240. In further embodiments, support posts (not shown) may be mounted on the host PCB 234, and the semiconductor package 200 may be mounted on top of the support posts, to support the semiconductor package 200 over discrete components.

Figure 28:
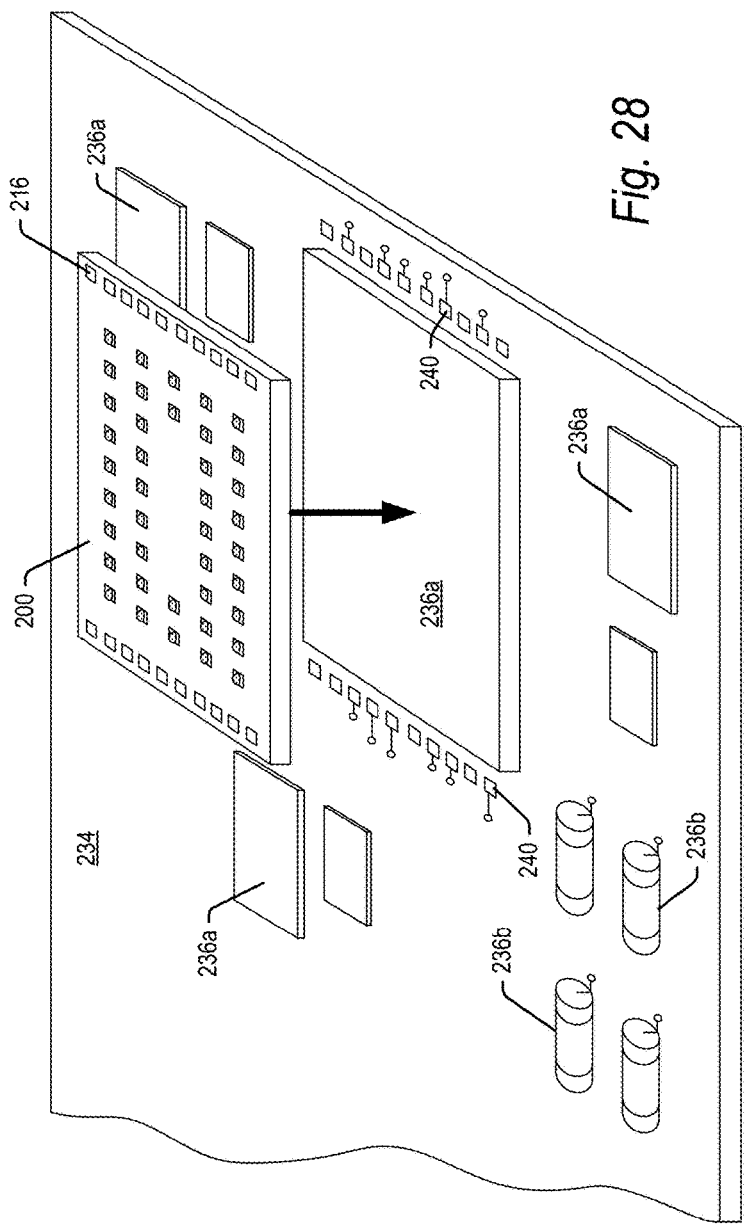
FIG. 28 is a perspective view of a semiconductor package including reclaim pads positioned for mounting on a printed circuit board according to embodiments of the present technology.
Figure 29:
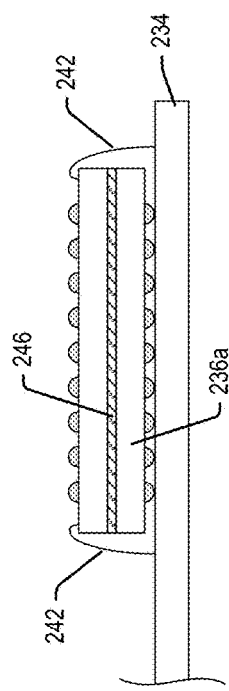
FIG. 29 is a side view of a semiconductor package including reclaim pads mounted on a printed circuit board according to embodiments of the present technology.

In a further example shown in FIGS. 28-29, the semiconductor package 200 may be affixed to the host PCB 234 on top of one or more semiconductor die or one or more semiconductor packages 236*a*. The die/package 236*a* may be electrically coupled to the host PCB 234 by solder bumps (as shown), wire bonds or surface mounting. As noted, semiconductor package 200 may be mounted on the die/package 236*a* using an adhesive 246, which may for example be a thermal conductor. In embodiments, a heat sink (not shown) may also be used at the interface between the semiconductor package 200 and the die/package 236*a* on which the package 200 is mounted.

In summary, in one example, the present technology relates to a semiconductor package for mounting on a host printed circuit board having one of first and second different configurations of electrical contacts for electrically connecting the semiconductor package, the semiconductor package comprising: a substrate; and a semiconductor die mounted to the substrate and electrically connected to the substrate; the semiconductor package configured to electrically connect to the first configuration of electrical contacts and the second configuration of electrical contacts.

In a further example, the present technology relates to a semiconductor package for mounting on host printed circuit boards, the semiconductor package comprising: a substrate; a semiconductor die mounted to the substrate and electrically connected to the substrate; a first set of electrical interconnections configured to electrically connect the semiconductor package to a first set of electrical contacts on a first printed circuit board of the host printed circuit boards; and a second set of electrical interconnections configured to electrically connect the semiconductor package to a second set of electrical contacts on a second printed circuit board of the host printed circuit boards, the first set of electrical contacts having a different configuration than the second sets of electrical contacts.

In a further example, the present technology relates to a semiconductor package for mounting on host printed circuit boards, the semiconductor package comprising: a substrate; at least one semiconductor die mounted to the substrate and electrically connected to the substrate; a plurality of solder bumps on a plurality of solder bump pads on a first surface of the substrate, the plurality of solder bumps configured to affix the semiconductor package to a first host printed circuit board of the host printed circuit boards with the first surface of the substrate facing the first host printed circuit board; and a plurality of contact pads on the first surface of the substrate, the plurality of contact pads configured to affix the semiconductor package to a second host printed circuit board of the host printed circuit boards with the first surface of the substrate facing away from the second host printed circuit board.

In another example, the present technology relates to a printed circuit board for a host device, comprising: a semiconductor package mounted on the printed circuit board, the semiconductor package comprising: a substrate; a first semiconductor die connected to the substrate; a second semiconductor die connected to the substrate; a set of electrical contacts on a surface of the substrate directly connected to the second semiconductor die; and a first controller die mounted on the printed circuit board, the controller die accessing the second semiconductor die by the first set of electrical contacts upon a fault in the first semiconductor die.

In a further example, the present technology relates to a printed circuit board for a host device, comprising: a semiconductor package mounted on the printed circuit board, the semiconductor package comprising: a substrate; a first semiconductor die connected to the substrate; a memory die connected to the substrate; a first set of electrical contacts on a first surface of the substrate electrically directly connected to the first semiconductor die; a second set of electrical contacts on the first surface of the substrate electrically directly connected to the memory die; and a first controller die mounted on the printed circuit board, the controller die accessing the memory die in the semiconductor package via the second set of electrical contacts upon a fault in the first semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package configured to be affixed to a printed circuit board (PCB) comprising:
   a substrate;
   a first semiconductor die mounted to the substrate and electrically connected to the substrate;
   a second semiconductor die mounted to the substrate and electrically connected to the substrate;
   electrical traces as part of the substrate electrically connecting the first semiconductor to the second semiconductor;
   a first set of electrical contacts on a surface of the substrate, the first set of electrical contacts electrically connected to the second semiconductor die through the substrate; and
   a second set of electrical contacts on a surface of the substrate, the second set of electrical contacts electrically connected to the first semiconductor die through the substrate, the semiconductor package configured to transmit signals between the semiconductor package and the PCB via the first set of electrical contacts when the second semiconductor die is operational, and the semiconductor package configured to transmit signals between the semiconductor package and the PCB via the second set of electrical contacts when the second semiconductor die is not operational.

2. The semiconductor package of claim 1, wherein the first and second sets of electrical contacts are provided in a first surface of the semiconductor package, and wherein the semiconductor package is configured to be affixed to the PCB with the first surface facing the PCB when the second semiconductor die is operational.

3. The semiconductor package of claim 2, wherein the semiconductor package is configured to be affixed to the PCB with the first surface facing away from the PCB when the second semiconductor die is not operational.

4. The semiconductor package of claim 3, wherein the semiconductor package is configured to electrically couple the first set of electrical contacts to the PCB by solder bumps when the second semiconductor die is operational, and wherein the semiconductor package is configured to electrically couple the second set of electrical contacts to the PCB by wire bonds when the second semiconductor die is not operational.

5. The semiconductor package of claim 1, wherein the first and second sets of electrical contacts are provided in a first surface of the semiconductor package, and wherein the semiconductor package is configured to be affixed to the PCB with the first surface facing the PCB when the second semiconductor die is operational and when the second semiconductor die is not operational 4, the second set of electrical interconnections on the first surface of the substrate comprising contact pads for wire bonding the semiconductor package to the second configuration of electrical contacts on the host printed circuit board.

6. A printed circuit board for a host device, comprising:
  a semiconductor package mounted on the printed circuit board, the semiconductor package comprising:
    a substrate;
    a first semiconductor die connected to the substrate;
    a memory die connected to the substrate;
    a first set of electrical contacts on a first surface of the substrate electrically directly connected to the first semiconductor die;
    a second set of electrical contacts on the first surface of the substrate electrically directly connected to the memory die; and
    a first controller die, the semiconductor package configured to electrically couple the first set of electrical contacts, and not the second set of electrical contacts, to the printed circuit board to transfer signals to and from the memory die via the first set of electrical contacts when the first semiconductor die is operational, and the semiconductor package configured to electrically couple the second set of electrical contacts, and not the first set of electrical contacts, to the printed circuit board to allow the first controller die to access the memory die in the semiconductor package via the second set of electrical contacts upon a fault in the first semiconductor die.

7. The printed circuit board of claim 6, the first semiconductor die comprising a second controller die and the memory die comprising a non-volatile memory die.

8. The printed circuit board of claim 6, the semiconductor package further comprising a second controller die.

9. The printed circuit board of claim 6, the first semiconductor die comprising a second controller die and the memory die comprising a volatile memory die.

10. The printed circuit board of claim 6, the first semiconductor die comprising a volatile memory die, and the second semiconductor die comprising a non-volatile memory die.

11. The printed circuit board of claim 6, the first semiconductor die comprising a non-volatile memory die, and the second semiconductor die comprising a volatile memory die.

* * * * *